(12) United States Patent
Abe

(10) Patent No.: US 7,130,875 B2
(45) Date of Patent: Oct. 31, 2006

(54) DIGITAL FILTER COEFFICIENT SETTING APPARATUS AND DIGITAL FILTER COEFFICIENT SETTING METHOD

(75) Inventor: Ryoji Abe, Kanagawa-ken (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 696 days.

(21) Appl. No.: 10/368,860

(22) Filed: Feb. 19, 2003

(65) Prior Publication Data

US 2003/0158878 A1    Aug. 21, 2003

(30) Foreign Application Priority Data

Feb. 20, 2002    (JP) ............................. 2002-043444

(51) Int. Cl.
*G06F 17/10* (2006.01)
(52) U.S. Cl. ..................................... 708/322
(58) Field of Classification Search ................ 708/300, 708/322
See application file for complete search history.

(56) References Cited

U.S. PATENT DOCUMENTS

| 6,219,392 B1* | 4/2001 | Abe | 375/350 |
| 6,404,832 B1* | 6/2002 | Abe | 375/350 |
| 6,581,080 B1* | 6/2003 | Richards | 708/320 |

* cited by examiner

*Primary Examiner*—D. H. Malzahn
(74) *Attorney, Agent, or Firm*—Pearne & Gordon LLP

(57) ABSTRACT

Herein disclosed is a digital filter coefficient setting apparatus which can search and select a specified filter coefficient element corresponding to a specified coefficient parameter inputted by a parameter inputting unit from among the plurality of filter coefficient elements stored in a coefficient storing unit and calculate a specified filter coefficient element on the basis of the specified coefficient parameter when the specified filter coefficient element is not selected from among the plurality of filter coefficient elements stored in the coefficient storing unit, thereby enabling to efficiently set a digital filter in response to a specified filter coefficient element corresponding to any possible specified coefficient parameter inputted therein, as well as to reduce a time required for obtaining the specified filter coefficient element.

20 Claims, 10 Drawing Sheets

FIG.10 (a) PRIOR ART
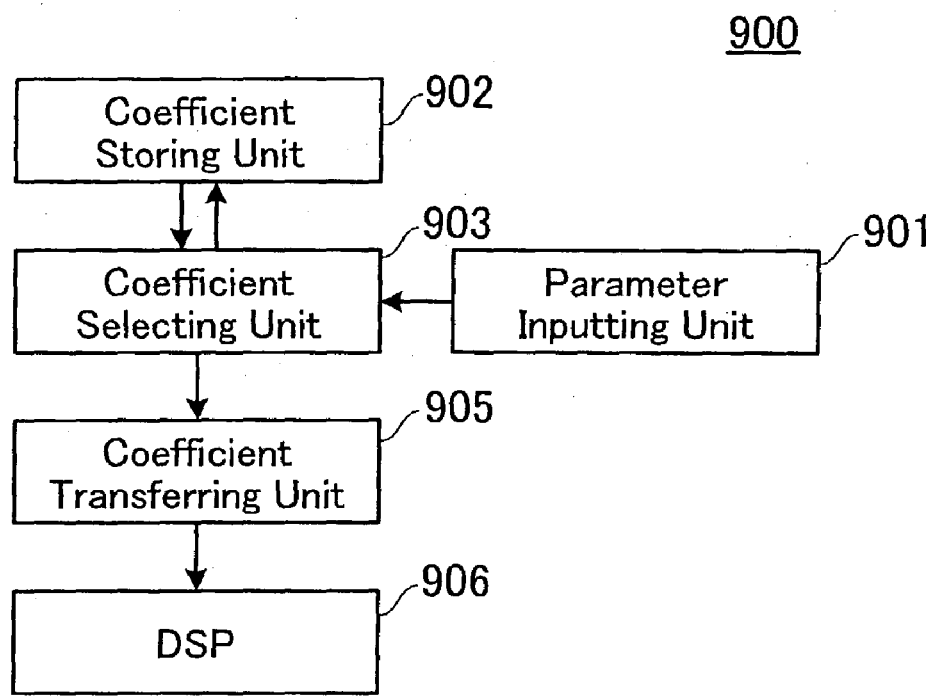
FIG.10 (b) PRIOR ART
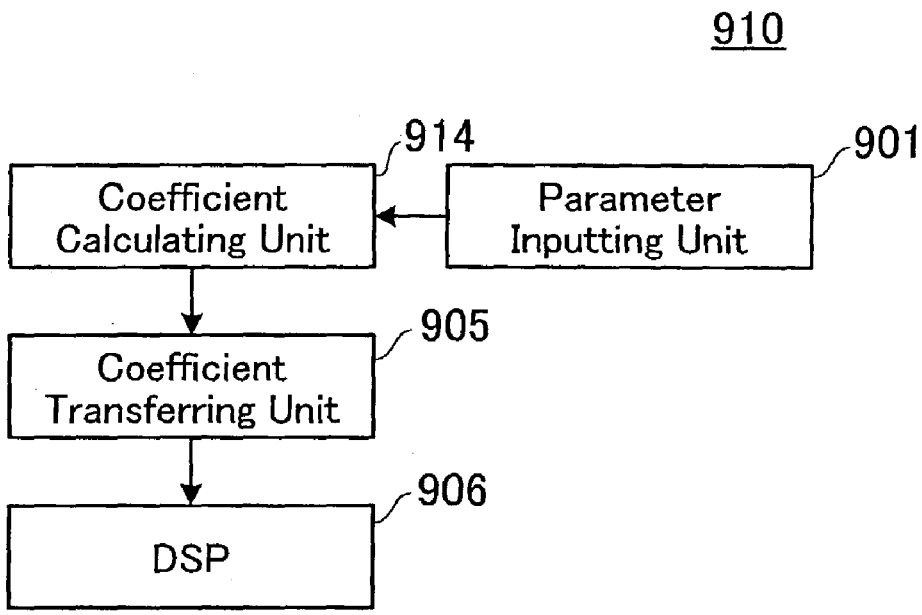

DIGITAL FILTER COEFFICIENT SETTING APPARATUS AND DIGITAL FILTER COEFFICIENT SETTING METHOD

BACKGROUND OF INTENTION

1. Field of the Invention

The present invention relates to a digital filter coefficient setting apparatus and a digital filter coefficient setting method, and more particularly, to a digital filter coefficient setting apparatus for and a digital filter coefficient setting method of setting a digital filter in response to a specified filter coefficient element.

2. Description of the Related Art

The digital filter is designed to filter a digitally encoded input signal. The digital filter has characteristics such as, for example, a passband, i.e., a frequency range over which the power of the input signal is passed to the filter output with approximately unity gain, a stopband, i.e., a frequency range where the power of the input signal is attenuated to a level which can be considered virtually absent in the output signal, and a cut-off frequency, i.e., a frequency, at which the power of the output signal is half the power of the input signal, wherein the cut-off frequency is provided in a transition band between the passband and the stopband. The digital filter is capable of, for example, altering the magnitude, frequency, or phase response of a digital signal in accordance with the digital filter characteristics. The digital filter characteristics of the digital filter can be approximately defined by known equations with filter coefficients. This means that the digital filter characteristics of the digital filter can be approximately determined by substituting a predetermined number of values for the filter coefficients in the equations.

Up until now, there have been proposed a wide variety of digital filter coefficient setting apparatuses each of which is operative to set a digital filter in response to a specified filter coefficient element. The filter coefficient element herein used is intended to mean a value to be substituted for one of the digital filter coefficients in the aforementioned equations. The filter coefficient element determines one of the digital filter characteristics of the digital filter. The conventional digital filter coefficient setting apparatus of this type is disclosed in, for example, the Japanese Patent Laid-Open Publication No. S60-182815.

One typical example of the conventional digital filter setting apparatus, hereinlater referred to as a first conventional digital filter setting apparatus 900, is shown in FIG. 10(a) as comprising a digital signal processor 906, hereinlater referred to simply as "DSP 906", equipped with a digital filter, which is operable to filter a digital signal in accordance with a digital filter characteristic varied in response to a filter coefficient element, a coefficient storing unit 902 for storing a predetermined number of filter coefficient elements respectively in association with a predetermined number of coefficient parameters, a parameter inputting unit 901 for inputting a specified coefficient parameter, a coefficient selecting unit 903 for searching and selecting a specified filter coefficient element corresponding to the specified coefficient parameter inputted by the parameter inputting unit 901 from among the predetermined number of filter coefficient elements stored in the coefficient storing unit 902, and a coefficient transferring unit 905 for transferring the specified filter coefficient element thus searched and selected by the coefficient selecting unit 903 to the DSP 906. The DSP 906 is operative to set the digital filter in response to the specified filter coefficient element thus received.

The first conventional digital filter setting apparatus 900 shown in FIG. 10(a), however, encounters a drawback that the first conventional digital filter setting apparatus 900 may not set the digital filter in response to a specified filter coefficient element resulting from the fact that the coefficient selecting unit 903 of the first conventional digital filter setting apparatus 900 can search and select a specified filter coefficient element corresponding to a specified coefficient parameter only from among the predetermined number of filter coefficient elements stored in the coefficient storing unit 902, but cannot search and select a specified filter coefficient element, which is not stored in the coefficient storing unit 902. Furthermore, the coefficient storing unit 902 is required to store a large number of filter coefficient elements respectively in association with a large number of coefficient parameters in order to make it possible for the coefficient selecting unit 903 to search and select a specified filter coefficient element corresponding to any possible specified coefficient parameter to be inputted by the parameter inputting unit 901.

Another typical example of the conventional digital filter setting apparatus, hereinlater referred to as a second conventional digital filter setting apparatus 910, is shown in FIG. 10(b) as comprising a DSP 906, equipped with a digital filter, which is operable to filter a digital signal in accordance with a digital filter characteristic varied in response to a filter coefficient element, a parameter inputting unit 901 for inputting a specified coefficient parameter, a coefficient calculating unit 914 for calculating a specified filter coefficient element on the basis of the specified coefficient parameter inputted by the parameter inputting unit 901, and a coefficient transferring unit 905 for transferring the specified filter coefficient element thus calculated by the coefficient calculating unit 914 to the DSP 906. The DSP 906 is operative to set the digital filter in response to the filter coefficient element thus received. The second conventional digital filter setting apparatus 910 thus constructed may calculate and obtain a specified filter coefficient element corresponding to any possible specified coefficient parameter to be inputted by the parameter inputting unit 901, and set the digital filter in response to the specified filter coefficient element thus calculated and obtained. This leads to the fact that the second conventional digital filter setting apparatus 910 shown in FIG. 10(b) can solve the aforesaid problem.

The second conventional digital filter setting apparatus 910, however, encounters another drawback that the second conventional digital filter setting apparatus 910 may delay in setting the digital filter equipped in the DSP 906 in response to a specified filter coefficient element resulting from the fact that the coefficient calculating unit 914 cannot calculate and obtain the specified filter coefficient element instantaneously. The present invention is made with a view to overcoming the previously mentioned drawbacks inherent to the conventional digital filter setting apparatuses.

SUMMARY OF THE INVENTION

It is, therefore, an object of the present invention to provide a digital filter coefficient setting apparatus, which enables to efficiently set a digital filter in response to a specified filter coefficient element corresponding to any possible specified coefficient parameter or signal inputted therein, as well as to reduce a time required for obtaining the specified filter coefficient element.

It is another object of the present invention to provide a digital filter coefficient setting method, which enables to efficiently set a digital filter in response to a specified filter coefficient element corresponding to any possible specified coefficient parameter or signal inputted therein, as well as to reduce a time required for obtaining the specified filter coefficient element.

In accordance with a first aspect of the present invention, there is provided digital filter coefficient setting apparatus comprising: a processor including a digital filter for filtering a digital signal in accordance with a digital filter characteristic varied in response to a filter coefficient element; a coefficient storing unit for storing a plurality of filter coefficient elements respectively in association with a plurality of coefficient parameters; a parameter inputting unit for inputting a specified coefficient parameter; a coefficient selecting unit for searching and selecting a specified filter coefficient element corresponding to the specified coefficient parameter inputted by the parameter inputting unit from among the plurality of filter coefficient elements stored in the coefficient storing unit, judging whether the specified filter coefficient element is selected or not from among the plurality of filter coefficient elements stored in the coefficient storing unit, outputting an address indicating a location of the specified filter coefficient element in the coefficient storing unit when it is judged that the specified filter coefficient element is searched and selected, and outputting the specified coefficient parameter when it is judged that the specified filter coefficient element is not selected; a coefficient obtaining unit for obtaining the specified filter coefficient element stored in the coefficient storing unit with reference to the address outputted by the coefficient selecting unit, and outputting the specified filter coefficient element thus obtained to the processor; and a coefficient calculating unit for calculating a specified filter coefficient element on the basis of the specified coefficient parameter inputted by the parameter inputting unit and outputting the specified filter coefficient element thus calculated to the processor when the specified filter coefficient element is not selected by the coefficient selecting unit, whereby the coefficient selecting unit is operative to output the specified coefficient parameter to the coefficient calculating unit when it is judged that the specified filter coefficient element is not selected, and the processor is operative to set the digital filter in response to the filter coefficient element thus received.

The aforesaid digital filter coefficient setting apparatus may further comprising a coefficient transferring unit for transferring the specified filter coefficient element obtained by the coefficient obtaining unit to the processor when the specified filter coefficient element is inputted from the coefficient obtaining unit and transferring the specified filter coefficient element calculated by the coefficient calculating unit to the processor when the specified filter coefficient element is inputted from the coefficient calculating unit.

The coefficient selecting unit of the aforesaid digital filter coefficient setting apparatus may output a calculation signal when it is judged that the specified filter coefficient element is not selected. The aforesaid digital filter coefficient setting apparatus further comprises a switching unit for outputting the address to the coefficient obtaining unit in response to address, and outputting the specified coefficient parameter to the coefficient calculating unit in response to the calculation signal.

The aforesaid digital filter coefficient setting apparatus may further comprise: a coefficient inputting unit for inputting a specified filter coefficient signal; and a coefficient setting unit for specifying a specified filter coefficient element in accordance with the specified filter coefficient signal inputted by the coefficient inputting unit.

The coefficient selecting unit of the aforesaid digital filter coefficient setting apparatus is operative to output a calculation signal when it is judged that the specified filter coefficient element is not selected. The aforesaid digital filter coefficient setting apparatus may further comprise a switching unit for outputting the address to the coefficient obtaining unit in response to the address inputted from the coefficient selecting unit, outputting the specified coefficient parameter to the coefficient calculating unit in response to the calculation signal inputted from the coefficient selecting unit, and outputting the specified filter coefficient signal to the coefficient setting unit in response to the specified filter coefficient signal inputted by the coefficient inputting unit.

In accordance with a second aspect of the present invention, the aforesaid digital filter coefficient setting apparatus further comprises: a calculated coefficient storing unit for storing the specified filter coefficient element calculated by the coefficient calculating unit in association with the specified coefficient parameter inputted by the parameter inputting unit therein. The aforesaid coefficient selecting unit is operative to search and select a specified filter coefficient element corresponding to the specified coefficient parameter inputted by the parameter inputting unit from among the plurality of filter coefficient elements stored in the coefficient storing unit and the calculated coefficient storing unit, to judge whether the specified filter coefficient element is selected or not from among the plurality of filter coefficient elements stored in the coefficient storing unit and the calculated coefficient storing unit, to output an address indicating a location of the specified filter coefficient element in the coefficient storing unit and the calculated coefficient storing unit when it is judged that the specified filter coefficient element is searched and selected in the coefficient storing unit and the calculated coefficient storing unit, and to output the specified coefficient parameter to the coefficient calculating unit when it is judged that the specified filter coefficient element is not selected in the coefficient storing unit and the calculated coefficient storing unit. The aforesaid coefficient obtaining unit is operative to obtain the specified filter coefficient element stored in the coefficient storing unit and the calculated coefficient storing unit with reference to the address outputted by the coefficient selecting unit, and to output the specified filter coefficient element thus obtained to the processor. The aforesaid calculated coefficient storing unit may include the coefficient storing unit. The aforesaid digital filter coefficient setting apparatus may further comprises: a coefficient writing unit for writing one or more specified filter coefficient elements stored in the calculated coefficient storing unit in association with respective one or more specified coefficient parameters into the coefficient storing unit.

In accordance with a fourth aspect of the present invention, the calculated coefficient storing unit of the digital filter coefficient setting apparatus may clear the specified filter coefficient elements stored therein when the digital filter coefficient setting apparatus is powered-off. The digital filter coefficient setting apparatus further comprises: a power-on detecting unit for detecting that the digital filter coefficient setting apparatus is powered-on, and outputting a power-on signal to the coefficient calculating unit when it is detected that the digital filter coefficient setting apparatus is powered-on. The coefficient calculating unit has a storage portion for storing a predetermined number of fundamental coefficient parameters. The coefficient calculating unit is operative to calculate a predetermined number of fundamental filter coefficient elements on the basis of the fundamental coefficient parameters stored in the storage portion in response to the power-on signal outputted by the power-on detecting unit, and the calculated coefficient storing unit is operative to store the fundamental filter coefficient elements thus calculated by the coefficient calculating unit in association with the respective fundamental coefficient parameters stored in the storage portion of the coefficient calculating unit.

The aforesaid digital filter coefficient setting apparatus may further comprise a CPU for controlling operations performed in the digital filter coefficient setting apparatus, the CPU having a CPU load fluctuated in response to the operations; and a CPU load judging unit for measuring the CPU load of the CPU, judging whether the CPU load thus measured exceeds a predetermined value or not, and outputting a first signal when it is judged that the CPU load thus measured does not exceed a predetermined value, and a second signal when it is judged that the CPU load thus measured exceeds a predetermined value. The parameter inputting unit and the coefficient inputting unit collectively forms a command inputting unit. The command inputting unit assumes two outputting modes including a first outputting mode to output the specified coefficient parameter to the coefficient selecting unit and a second outputting mode to output the specified filter coefficient signal to the coefficient setting unit when the specified coefficient parameter and the specified filter coefficient signal are inputted. The command inputting unit is operative to assume the first outputting mode to output the specified coefficient parameter to the coefficient selecting unit in response to the first signal and to assume the second outputting mode to output the specified filter coefficient signal to the coefficient setting unit in response to the second signal when the specified coefficient parameter and the specified filter coefficient signal are inputted.

In accordance with a fifth aspect of the present invention, there is provided a digital filter coefficient setting method comprising the steps of: a storing step of storing a plurality of filter coefficient elements respectively in association with a plurality of coefficient parameters in a coefficient storing unit; a parameter inputting step of inputting a specified coefficient parameter, the specified coefficient parameter; a coefficient selecting step of searching and selecting a specified filter coefficient element corresponding to the specified coefficient parameter inputted in the parameter inputting step from among the plurality of filter coefficient elements stored in the coefficient storing unit; a judging step of judging whether the specified filter coefficient element is selected or not from among the plurality of filter coefficient elements stored in the coefficient storing unit; an address outputting step of outputting an address indicating a location of the specified filter coefficient element in the coefficient storing unit when it is judged in the judging step that the specified filter coefficient element is searched and selected; a coefficient outputting step of outputting the specified coefficient parameter when it is judged in the judging step that the specified filter coefficient element is not selected, a coefficient obtaining step of obtaining the specified filter coefficient element stored in the coefficient storing unit with reference to the address outputted in the address outputting step; a setting step of setting a digital filter in response to the filter coefficient element obtained in the coefficient obtaining step; and a coefficient calculating step of calculating a specified filter coefficient element on the basis of the specified coefficient parameter outputted in the coefficient outputting step, whereby the setting step has a step of setting a digital filter in response to the filter coefficient element calculated in the coefficient calculating step.

BRIEF DESCRIPTION OF THE DRAWINGS

The objects, features and advantages of the present invention will become apparent as the description proceeds when taken in conjunction with the accompanying drawings, in which:

FIG. 10($a$) is a block diagram of a first conventional digital filter coefficient setting apparatus; and FIG. 10($b$) is a block diagram of a second conventional digital filter coefficient setting apparatus.

DESCRIPTION OF THE PREFERRED EMBODIMENTS

Figure 1:
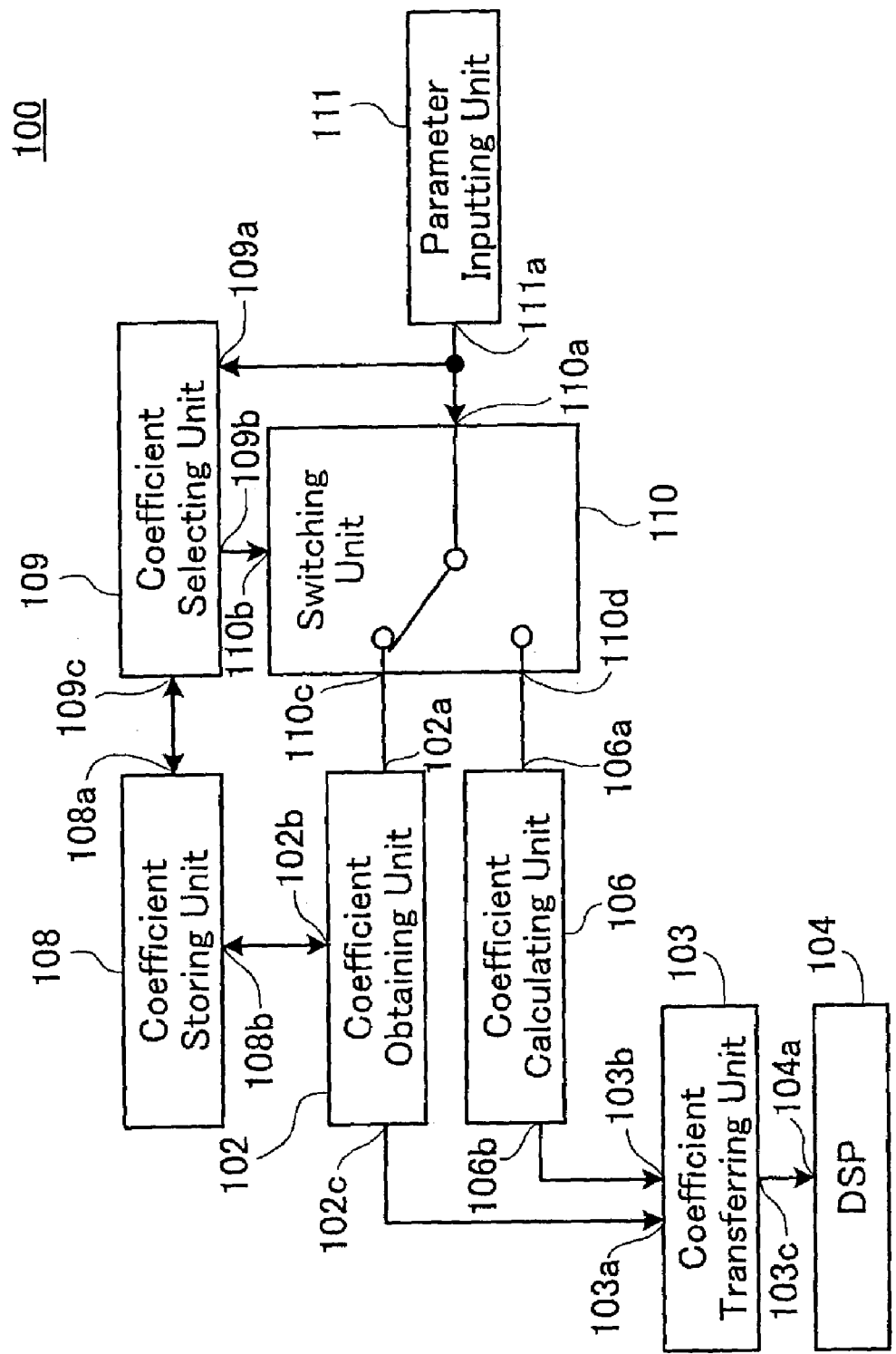
FIG. 1 is a block diagram of a first embodiment of a digital filter coefficient setting apparatus according to the present invention.

Throughout the following detailed description, similar reference characters and numbers refer to similar elements in all figures of the drawings.

The first preferred embodiment of the digital filter coefficient setting apparatus according to the present invention will now be described in detail in accordance with the accompanying drawings.

Figure 2:
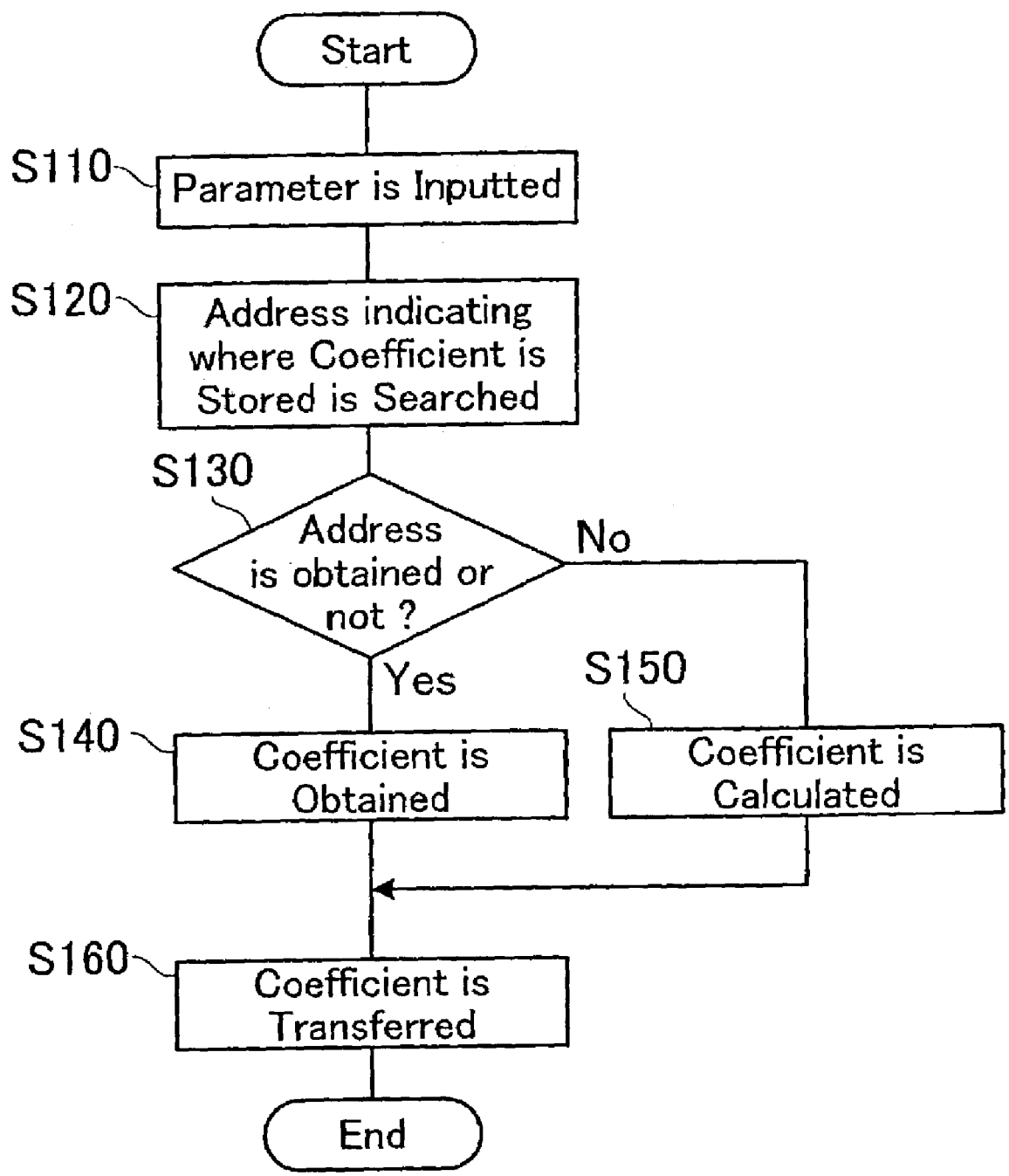
FIG. 2 is a flow chart explaining a digital filter coefficient setting method performed by the digital filter coefficient setting apparatus shown in FIG. 1.

Referring now to the drawings, in particular to FIGS. 1 and 2, there is shown a first preferred embodiment of the digital filter coefficient setting apparatus 100 according to the present invention. The digital filter coefficient setting apparatus 100 is shown in FIG. 1 as comprising a coefficient obtaining unit 102, a coefficient transferring unit 103, a processor 104 including a digital filter, not shown, a coefficient calculating unit 106, a coefficient storing unit 108, a coefficient selecting unit 109, a switching unit 110, and a parameter inputting unit 111.

The digital filter included in the processor 104 is operable to filter a digital signal in accordance with a digital filter characteristic. The digital filter characteristic of the digital filter is varied in response to a filter coefficient element.

The parameter inputting unit 111 is adapted to input a specified coefficient parameter. Each of the coefficient parameters corresponds to a filter coefficient element. The coefficient parameter herein used may be, for example, but not limited to, an information element specifying a frequency bandwidth, an output level in the specified frequency bandwidth, or the like. The parameter inputting unit 111 has a terminal 111a having the specified coefficient parameter outputted therethrough.

The coefficient storing unit 108 is adapted to store a plurality of filter coefficient elements respectively in association with a plurality of coefficient parameters. The coefficient selecting unit 109 is adapted to search and select a specified filter coefficient element corresponding to the specified coefficient parameter inputted by the parameter inputting unit 111 from among the plurality of filter coefficient elements stored in the coefficient storing unit 108, and judge whether the specified filter coefficient element is selected or not from among the plurality of filter coefficient elements stored in the coefficient storing unit 108. The filter coefficient element determines a characteristic of the digital filter. Each of the filter coefficient elements stored in the coefficient storing unit 108 corresponds to a coefficient parameter. Preferably, the filter coefficient elements stored in the coefficient storing unit 108 should be filter coefficient elements expected to be frequently searched and selected by the coefficient selecting unit 109. The coefficient selecting unit 109 is adapted to output an address indicating a location of the specified filter coefficient element in the coefficient storing unit 108 when it is judged that the specified filter coefficient element is searched and selected, and to output a calculation signal when it is judged that the specified filter coefficient element is not selected.

The switching unit 110 is adapted to input the specified coefficient parameter from the parameter inputting unit 111 and the address or the calculation signal from the coefficient selecting unit 109. The switching unit 110 is adapted to output the address to the coefficient obtaining unit 102 in response to the address inputted from the coefficient selecting unit 109, and to output the specified coefficient parameter to coefficient calculation unit 106 in response to the calculation signal inputted by the coefficient selecting unit 109.

The switching unit 110 has a first terminal 110a having the specified coefficient parameter inputted therethrough, a second terminal 110b having the address or the calculation signal inputted therethrough, a third terminal 110c having the address outputted therethrough, and a fourth terminal 110d having the specified coefficient parameter outputted therethrough.

The coefficient obtaining unit 102 is adapted to obtain the specified filter coefficient element stored in the coefficient storing unit 108 with reference to the address outputted by the coefficient selecting unit 109, and to output the specified filter coefficient element thus obtained to the processor 104 via the coefficient transferring unit 103.

The coefficient calculating unit 106 is adapted to calculate a specified filter coefficient element on the basis of the specified coefficient parameter inputted by the parameter inputting unit 111 and to output the specified filter coefficient element thus calculated to the processor 104 via the coefficient transferring unit 103 when the specified filter coefficient element is not selected by the coefficient selecting unit 109.

This means that the coefficient selecting unit 109 is operative to output the address to the coefficient obtaining unit 102 by way of the switching unit 110 when it is judged that the specified filter coefficient element is searched and selected. The coefficient selecting unit 109 is operative to output the specified coefficient parameter to the coefficient calculating unit 106 by way of the switching unit 110 when, on the other hand, it is judged that the specified filter coefficient element is not selected. The coefficient calculating unit 106 is operative to calculate a specified filter coefficient element on the basis of the specified coefficient parameter in response to the specified coefficient parameter thus inputted from the switching unit 110.

The coefficient storing unit 108 has a first terminal 108a having the specified coefficient parameter inputted therethrough and the address outputted therethrough, and a second terminal 108b having the specified coefficient parameter outputted therethrough and the address inputted therethrough. The coefficient selecting unit 109 has a first terminal 109a having the specified coefficient parameter inputted therethrough, a second terminal 109b having the address or the calculation signal outputted therethrough, and a third terminal 109c having the specified coefficient parameter outputted therethrough and the address inputted therethrough.

The coefficient obtaining unit 102 has a first terminal 102a having the address inputted therethrough, a second terminal 102b having the address outputted therethrough and the specified filter coefficient element inputted therethrough, and a third terminal 102c having the specified filter coefficient element outputted therethrough. The coefficient calculating unit 106 has a first terminal 106a having the specified coefficient parameter inputted therethrough and a second terminal 106b having the specified filter coefficient element outputted therethrough.

The coefficient transferring unit 103 is adapted to input the specified filter coefficient element obtained by the coefficient obtaining unit 102, and the specified filter coefficient element calculated by the coefficient calculating unit 106 and output the specified filter coefficient element thus inputted to the processor 104.

The coefficient transferring unit 103 has a first terminal 103a having the specified filter coefficient element obtained by the coefficient obtaining unit 102 inputted therethrough, and a second terminal 103b having the specified filter coefficient element calculated by the coefficient calculating unit 106 inputted therethrough, and a third terminal 103c having the specified filter coefficient element outputted therethrough.

The processor 104 has a terminal 104a having the filter coefficient element inputted therethrough. The processor 104 is operative to set the digital filter in response to the filter coefficient element thus received. The digital filter characteristic of the digital filter is defined by the filter coefficient element. The digital filter included in the processor 104 is operable to filter a digital signal in accordance with the digital filter characteristic defined by the filter coefficient element thus received.

The operation of the first embodiment of the digital filter coefficient setting apparatus 100 will be described hereinlater with reference to the flow chart shown in FIG. 2.

The flow chart appearing in FIG. 2 shows steps to be performed by the first embodiment of the digital filter coefficient setting apparatus 100 according to the present invention, however, the steps according to the present invention are not limited to these steps.

In step S110, the parameter inputting unit 111 is operated to input a specified coefficient parameter. The coefficient parameter may be, for example, but not limited to, an information element specifying a frequency bandwidth, an output level in the specified frequency bandwidth, or the like. The specified coefficient parameter corresponds to a specified filter coefficient element. Step S110 goes forward to step S120, in which the coefficient selecting unit 109 is operated to search and select a specified filter coefficient element corresponding to the specified coefficient parameter thus inputted from among the plurality of filter coefficient elements stored in the coefficient storing unit 108. This means that the coefficient selecting unit 109 is operated to search an address indicating where the specified coefficient parameter is stored in the coefficient storing unit 108 as stated in step S120 of the flow chart.

Step S120 goes forward to step S130, in which the coefficient selecting unit 109 is operated to judge whether the specified filter coefficient element is selected from among the plurality of filter coefficient elements stored in the coefficient storing unit 108 or not. This means that the coefficient selecting unit 109 is operated to judge whether the address indicating where the specified coefficient parameter is stored in the coefficient storing unit 108 is obtained or not as stated in step S130 of the flow chart.

When it is judged by the coefficient selecting unit 109 that the specified filter coefficient element is selected from among the plurality of filter coefficient elements stored in the coefficient storing unit 108, i.e., that the address indicating where the specified coefficient parameter is stored in the coefficient storing unit 108 is obtained, step S130 goes forward to step S140, in which the coefficient selecting unit 109 is operated to output an address indicating a location of the specified filter coefficient element in the coefficient storing unit 108. The coefficient obtaining unit 102 is then operated to obtain the specified filter coefficient element stored in the coefficient storing unit 108 with reference to the address outputted by the coefficient selecting unit 109. Step 140 goes forward to step S160.

When, on the other hand, it is judged by the coefficient selecting unit 109 that the specified filter coefficient element is not selected from among the plurality of filter coefficient elements stored in the coefficient storing unit 108, i.e., that the address indicating where the specified coefficient parameter is stored in the coefficient storing unit 108 is not obtained, step S130 goes forward to step S150, in which the coefficient selecting unit 109 is operated to output a calculation signal to the switching unit 110. The switching unit 110 is operated to output the specified coefficient parameter to the coefficient calculating unit 106 in response to the calculation signal outputted by the coefficient selecting unit 109. The coefficient calculating unit 106 is then operated to calculate a specified filter coefficient element on the basis of the specified coefficient parameter. Step S150 goes forward to step S160.

In step 160, the coefficient transferring unit 103 is operated to input the specified filter coefficient element from the coefficient obtaining unit 102 or from the coefficient calculating unit 106, and output the specified filter coefficient element thus inputted to the processor 104. The processor 104 is operated to set the digital filter in response to the filter coefficient element thus received. The digital filter characteristic of the digital filter is defined by the filter coefficient element. The digital filter included in the processor 140 is operated to filter the digital signal in accordance with a digital filter characteristic defined by the filter coefficient element thus set.

While it has been described in the above that the digital filter coefficient setting apparatus 100 comprises the switching unit 110, the digital filter coefficient setting apparatus 100 according to the present invention may not comprise the switching unit 110. This means that the coefficient selecting unit 109 may output the specified coefficient parameter inputted by the parameter inputting unit 111 to the coefficient calculating unit 106 when it is judged that the specified filter coefficient element is not selected from among the plurality of filter coefficient elements stored in the coefficient storing unit 108, and the coefficient calculating unit 106 calculates the specified filter coefficient element in response to the specified coefficient parameter.

From the foregoing description, it will be understood that the digital filter coefficient setting apparatus 100 according to the present invention can search and select a specified filter coefficient element corresponding to the specified coefficient parameter inputted by the parameter inputting unit 111 from among the plurality of filter coefficient elements stored in the coefficient storing unit 108. The digital filter coefficient setting apparatus 100 thus constructed can eliminate a process and a time required for calculating the specified filter coefficient element, thereby reducing a time required for obtaining the specified filter coefficient element.

Furthermore, the digital filter coefficient setting apparatus 100 according to the present invention can calculate a specified filter coefficient element on the basis of the specified coefficient parameter inputted by the parameter inputting unit 111 when the specified filter coefficient element is not selected from among the plurality of filter coefficient elements stored in the coefficient storing unit 108, thereby enabling to obtain a specified filter coefficient element corresponding to any possible specified coefficient parameter inputted therein and setting a digital filter in response to the specified filter coefficient element thus obtained.

As will be seen from the above description, the present embodiment of the digital filter coefficient setting apparatus 100 enables to efficiently set a digital filter in response to a specified filter coefficient element corresponding to any possible specified coefficient parameter inputted therein, as well as to reduce a time required for obtaining the specified filter coefficient element.

The second preferred embodiment of the digital filter coefficient setting apparatus according to the present invention will now be described in detail in accordance with the accompanying drawings.

Figure 3:
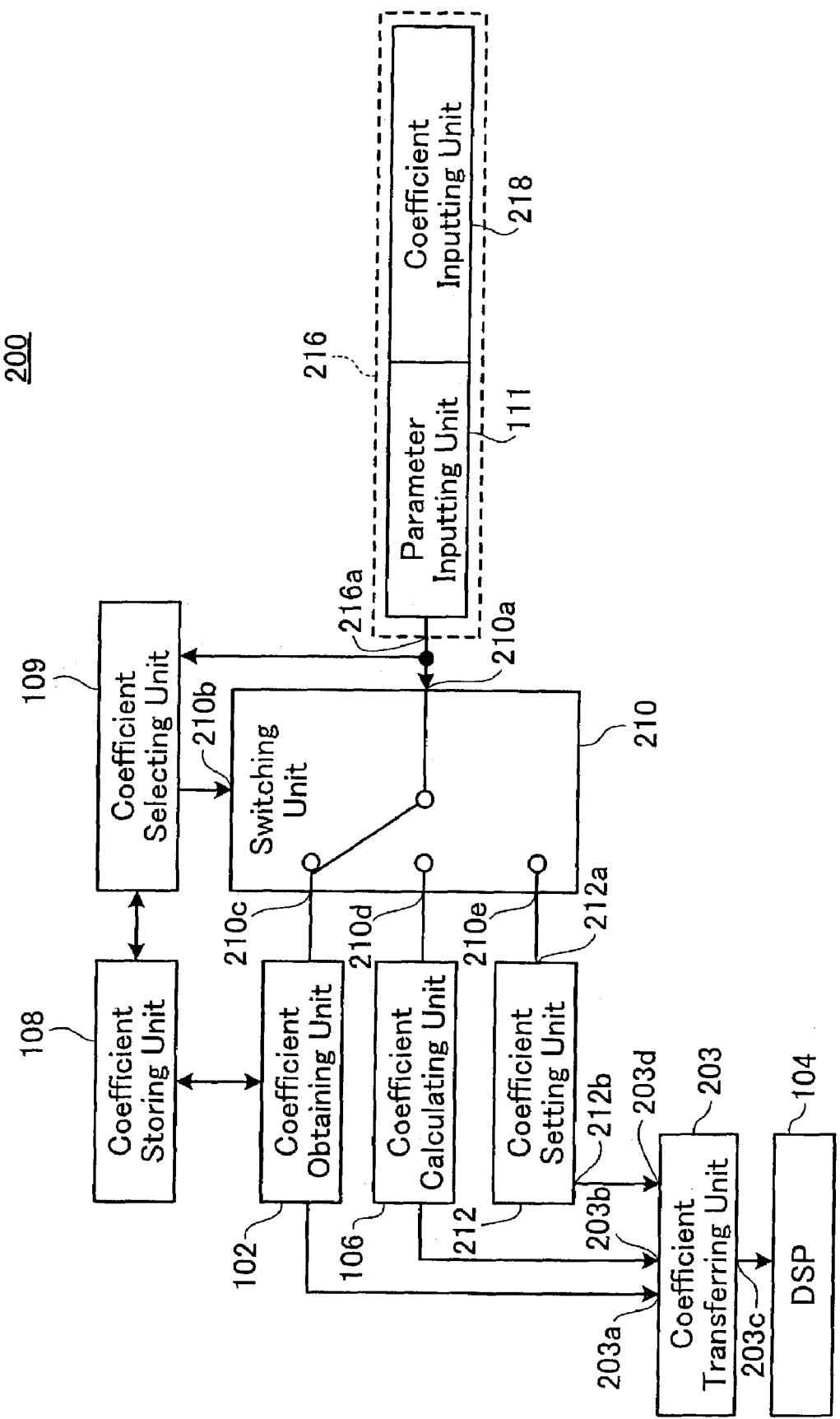
FIG. 3 is a block diagram of a second embodiment of a digital filter coefficient setting apparatus according to the present invention.

Referring now to the drawings, in particular to FIG. 3, there is shown a second preferred embodiment of the digital filter coefficient setting apparatus 200 according to the present invention.

The constitution of the second embodiment of the digital filter coefficient setting apparatus 200 according to the present invention will be described.

The digital filter coefficient setting apparatus 200 according to the present invention is shown in FIG. 3 as almost the same in construction as the first embodiment of the digital filter coefficient setting apparatus 100 according to the present invention except for the constitution elements and parts in the following description. Description about the same elements and parts of the second preferred embodiment as those of the first preferred embodiment will be omitted to avoid tedious repetition but the same references are given in FIG. 3 for the elements and parts of the second preferred embodiment as those of the first preferred embodiment in FIG. 1.

In contrast to the digital filter coefficient setting apparatus 100, the digital filter coefficient setting apparatus 200 comprises a switching unit 210, and a coefficient transferring unit 203 in place of the switching unit 110, and a coefficient transferring unit 103. The digital filter coefficient setting apparatus 200 further comprises a coefficient inputting unit

218 and a coefficient setting unit 212. The parameter inputting unit 111 and the coefficient inputting unit 218 collectively form a command inputting unit 216. The coefficient inputting unit 218 is adapted to input a specified filter coefficient signal. The coefficient setting unit 212 is adapted to specify and set a specified filter coefficient element in accordance with the specified filter coefficient signal inputted by the coefficient inputting unit 218. The filter coefficient signal herein used is intended to mean a signal indicative of a filter coefficient element.

The operation of the digital filter coefficient setting apparatus 200 according to the present invention is almost the same as that of the digital filter coefficient setting apparatus 100 except for the following operation.

The coefficient inputting unit 218 is operated to input a specified filter coefficient signal. The coefficient setting unit 212 is operated to specify and set a specified filter coefficient element in accordance with the specified filter coefficient signal inputted by the coefficient inputting unit 218.

The coefficient selecting unit 109 is operated to search and select a specified filter coefficient element corresponding to the specified coefficient parameter inputted by the parameter inputting unit 111 from among the plurality of filter coefficient elements stored in the coefficient storing unit 108, and judge whether the specified filter coefficient element is selected or not from among the plurality of filter coefficient elements stored in the coefficient storing unit 108.

The coefficient selecting unit 109 is operated to output an address indicating a location of the specified filter coefficient element in the coefficient storing unit 108 to the switching unit 210 when it is judged that the specified filter coefficient element is searched and selected. The coefficient selecting unit 109 is operated to output a calculation signal to the switching unit 210 when, on the other hand, it is judged that the specified filter coefficient element is not selected from among the plurality of filter coefficient elements stored in the coefficient storing unit 108. The switching unit 210 is operated to output the address to the coefficient obtaining unit 102 in response to the address inputted from the coefficient selecting unit 109. The switching unit 210 is operated to output the specified coefficient parameter to the coefficient calculating unit 106 in response to the calculation signal inputted from the coefficient selecting unit 109. The switching unit 210 is operated to output the specified filter coefficient signal to the coefficient setting unit 212 in response to the specified filter coefficient signal inputted by the coefficient inputting unit 218.

The coefficient transferring unit 203 is operated to transfer the specified filter coefficient element obtained by the coefficient obtaining unit 102 to the processor 104 in response to the specified filter coefficient element inputted from the coefficient obtaining unit 102. The coefficient transferring unit 203 is operated to transfer the specified filter coefficient element calculated by the coefficient calculating unit 106 to the processor 104 in response to the specified filter coefficient element inputted from the coefficient calculating unit 106. The coefficient transferring unit 203 is operated to transfer the specified filter coefficient element specified by the coefficient setting unit 212 to the processor 104 in response to the specified filter coefficient element specified by the coefficient setting unit 212.

The command inputting unit 216 has a terminal 216*a* having a specified coefficient parameter or a specified filter coefficient signal outputted therethrough. The switching unit 210 has a first terminal 110*a* having the specified coefficient parameter or the specified filter coefficient signal inputted therethrough, a second terminal 110*b* having the address or the calculation signal inputted therethrough, a third terminal 110*c* having the address outputted therethrough, a fourth terminal 110*d* having the specified coefficient parameter outputted therethrough, and a fifth terminal 110*e* having the specified filter coefficient signal outputted therethrough.

The coefficient setting unit 212 has a first terminal 212*a* having the specified filter coefficient signal inputted therethrough, and a second terminal 212*b* having the specified filter coefficient element outputted therethrough. The coefficient transferring unit 203 has a first terminal 203*a* having a having the specified filter coefficient element obtained by the coefficient obtaining unit 102 inputted therethrough, and a second terminal 203*b* having the specified filter coefficient element calculated by the coefficient calculating unit 106 inputted therethrough, a third terminal 203*c* having the specified filter coefficient element outputted therethrough, and a fourth terminal 203*d* having the specified filter coefficient element specified by the coefficient setting unit 212 inputted therethrough.

While it has been described in the above that the digital filter coefficient setting apparatus 200 comprises the switching unit 210, the digital filter coefficient setting apparatus 200 according to the present invention may not comprise the switching unit 210. This means that the digital filter coefficient setting apparatus 200 according to the present invention may not comprise the switching unit 210 as described hereinlater. This means that the coefficient selecting unit 109 may output the specified coefficient parameter inputted by the parameter inputting unit 111 to the coefficient calculating unit 106 when it is judged that the specified filter coefficient element is not selected from among the plurality of filter coefficient elements stored in the coefficient storing unit 108, and the coefficient calculating unit 106 calculates the specified filter coefficient element in response to the specified coefficient parameter. The coefficient inputting unit 218 may output the specified filter coefficient signal to the coefficient setting unit 212.

From the foregoing description, it will be understood that the digital filter coefficient setting apparatus 200 according to the present invention comprises a coefficient inputting unit 218 for inputting a specified filter coefficient signal and a coefficient setting unit 212 for specifying a specified filter coefficient element in accordance with the specified filter coefficient signal inputted by the coefficient inputting unit 218. The digital filter coefficient setting apparatus 200 thus constructed can eliminate a process and a time required for calculating the specified filter coefficient element, thereby enabling to reduce a time required for obtaining the specified filter coefficient element.

Furthermore, the digital filter coefficient setting apparatus 200 according to the present invention can specify a specified filter coefficient element in accordance with the specified filter coefficient signal, which cannot be inputted by the parameter inputting unit 111.

As will be seen from the above description, the present embodiment of the digital filter coefficient setting apparatus 200 enables to efficiently set a digital filter in response to a specified filter coefficient element corresponding to any possible specified coefficient parameter including a specified filter coefficient signal inputted therein, as well as to reduce a time required for obtaining the specified filter coefficient element.

The third preferred embodiment of the digital filter coefficient setting apparatus according to the present invention will now be described in detail in accordance with the accompanying drawings.

Figure 4:
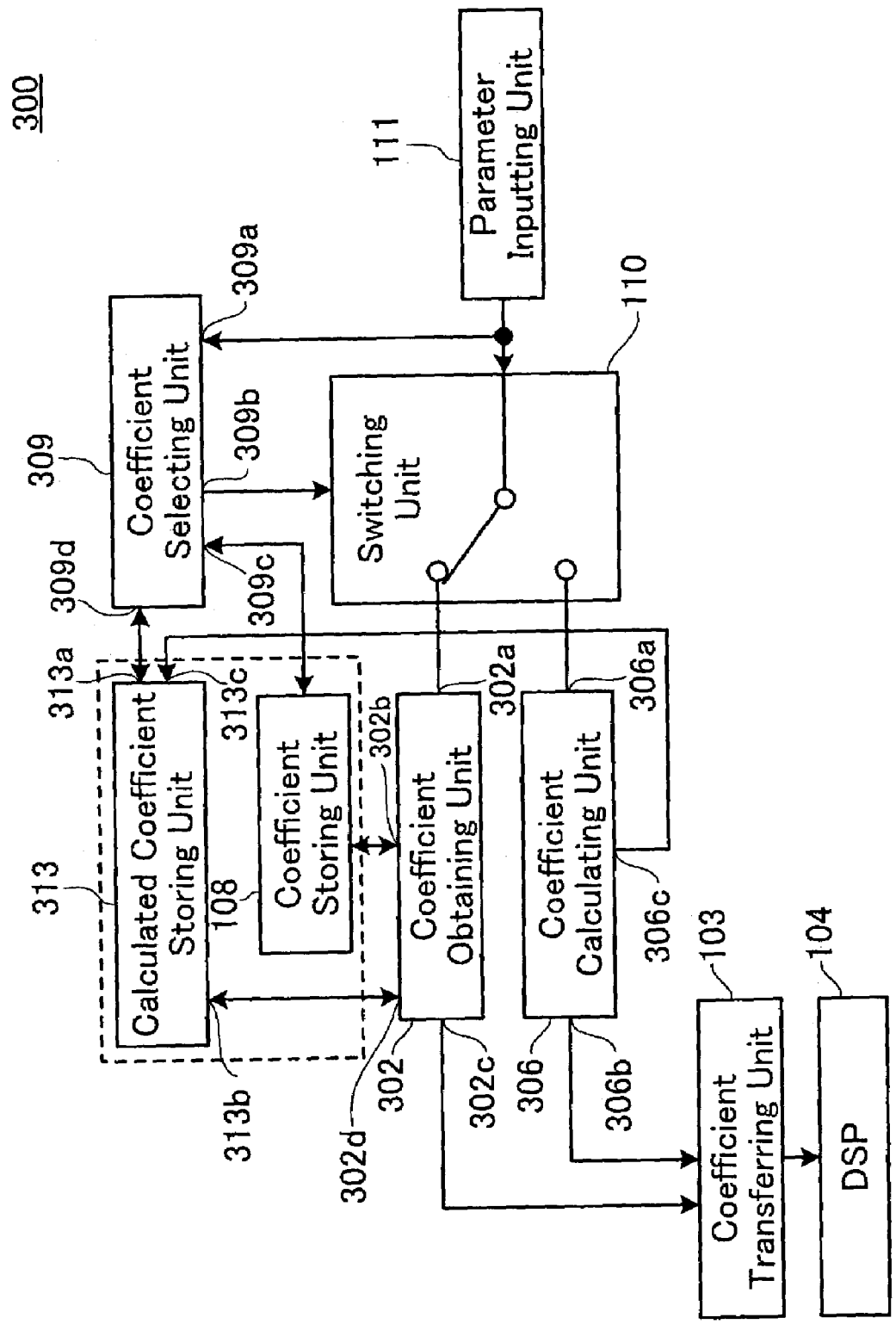
FIG. 4 is a block diagram of a third embodiment of a digital filter coefficient setting apparatus according to the present invention.

Referring now to the drawings, in particular to FIG. 4, there is shown a third preferred embodiment of the digital filter coefficient setting apparatus 300 according to the present invention.

The constitution of the third embodiment of the digital filter coefficient setting apparatus 300 according to the present invention will be described.

The digital filter coefficient setting apparatus 300 according to the present invention is shown in FIG. 4 as almost the same in construction as the first embodiment of the digital filter coefficient setting apparatus 100 according to the present invention except for the constitution elements and parts in the following description. Description about the same elements and parts of the third preferred embodiment as those of the first preferred embodiment will be omitted to avoid tedious repetition but the same references are given in FIG. 4 for the elements and parts of the third preferred embodiment as those of the first preferred embodiment in FIG. 1.

In contrast to the digital filter coefficient setting apparatus 100, the digital filter coefficient setting apparatus 300 comprises a coefficient selecting unit 309, a coefficient obtaining unit 302, and a coefficient calculating unit 306 in place of the coefficient selecting unit 109, the coefficient obtaining unit 102, and the coefficient calculating unit 106. The digital filter coefficient setting apparatus 300 further comprises a calculated coefficient storing unit 313. The calculated coefficient storing unit 313 is adapted to store the specified filter coefficient element calculated by the coefficient calculating unit 306. The specified filter coefficient element calculated by the coefficient calculating unit 306 corresponds to the specified coefficient parameter inputted by the parameter inputting unit 111.

The operation of the digital filter coefficient setting apparatus 300 according to the present invention is almost the same as that of the digital filter coefficient setting apparatus 100 except for the following operation.

The calculated coefficient storing unit 313 is operated to store the specified filter coefficient element calculated by the coefficient calculating unit 306 in association with the specified coefficient parameter inputted by the parameter inputting unit 111.

The coefficient selecting unit 309 is operated to search and select a specified filter coefficient element corresponding to the specified coefficient parameter inputted by the parameter inputting unit 111 from among the plurality of filter coefficient elements stored in the coefficient storing unit 108 and the calculated coefficient storing unit 313. The coefficient selecting unit 309 is operated to judge whether the specified filter coefficient element is selected or not from among the plurality of filter coefficient elements stored in the coefficient storing unit 108 and the calculated coefficient storing unit 313. The coefficient selecting unit 309 is then operated to output an address indicating a location of the specified filter coefficient element in the coefficient storing unit 108 and the calculated coefficient storing unit 313 when it is judged that the specified filter coefficient element is searched and selected in the coefficient storing unit 108 and the calculated coefficient storing unit 313. The coefficient selecting unit 309 is operated to output the specified coefficient parameter to the coefficient calculating unit 306 by way of the switching unit 110 when, on the other hand, it is judged that the specified filter coefficient element is not selected in the coefficient storing unit 108 and the calculated coefficient storing unit 313.

The coefficient obtaining unit 302 is operated to obtain the specified filter coefficient element stored in the coefficient storing unit 108 and the calculated coefficient storing unit 313 with reference to the address outputted by the coefficient selecting unit 309, and to output the specified filter coefficient element thus obtained to the processor 104.

The coefficient selecting unit 309 has a first terminal 309a having the specified coefficient parameter inputted therethrough, a second terminal 309b having the address or the calculation signal outputted therethrough, a third terminal 309c having the specified coefficient parameter outputted therethrough and the address inputted therethrough, and a fourth terminal 309d having the specified coefficient parameter outputted therethrough and the address inputted therethrough.

The calculated coefficient storing unit 313 has a first terminal 313a having the specified coefficient parameter inputted therethrough and the address outputted therethrough, a second terminal 313b having the address inputted therethrough and the specified filter coefficient element outputted therethrough, and a third terminal 313c having the specified filter coefficient element in association with the specified coefficient parameter inputted therethrough.

The coefficient obtaining unit 302 has a first terminal 302a having the address inputted therethrough, a second terminal 302b having the address outputted therethrough and the specified filter coefficient element inputted therethrough, a third terminal 302c having the specified filter coefficient element outputted therethrough, and a fourth terminal 302d having the address outputted therethrough and the specified filter coefficient element inputted therethrough. The coefficient calculating unit 306 has a first terminal 306a having the specified coefficient parameter inputted therethrough, a second terminal 306b having the specified filter coefficient element outputted therethrough, and a third terminal 306c having the specified filter coefficient element in association with the specified coefficient parameter outputted therethrough.

While it has been described in the above that the digital filter coefficient setting apparatus 300 comprises the switching unit 110, the digital filter coefficient setting apparatus 300 according to the present invention may not comprise the switching unit 110 as described in the previous embodiment.

Though the calculated coefficient storing unit 313 is shown in FIG. 4 as being separated from the coefficient storing unit 108, the calculated coefficient storing unit 313 exemplified by the present invention may include the coefficient storing unit 108.

From the foregoing description, it will be understood that the digital filter coefficient setting apparatus 300 according to the present invention comprises a calculated coefficient storing unit 313 for storing the specified filter coefficient element calculated by the coefficient calculating unit 306. The digital filter coefficient setting apparatus 300 thus constructed can eliminate a process of repeatedly calculating a specified filter coefficient element once calculated by the coefficient calculating unit 306 and stored in the calculated coefficient storing unit 313, thereby enabling to reduce a time required for obtaining the specified filter coefficient element.

The fourth preferred embodiment of the digital filter coefficient setting apparatus according to the present invention will now be described in detail in accordance with the accompanying drawings.

Figure 5:
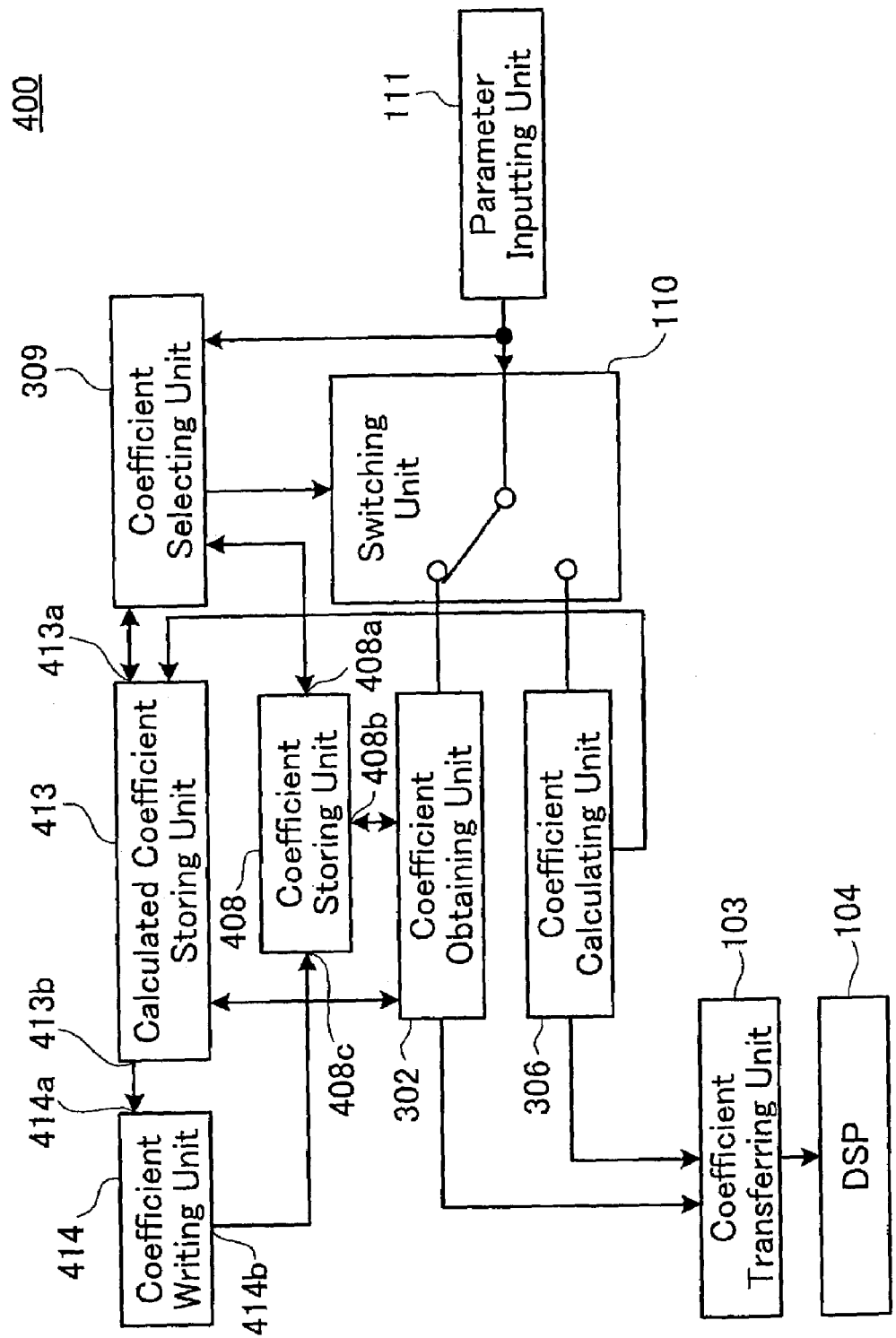
FIG. 5 is a block diagram of a fourth embodiment of a digital filter coefficient setting apparatus according to the present invention.

Referring now to the drawings, in particular to FIG. 5, there is shown a fourth preferred embodiment of the digital filter coefficient setting apparatus 400 according to the present invention.

The constitution of the fourth embodiment of the digital filter coefficient setting apparatus 400 according to the present invention will be described.

The digital filter coefficient setting apparatus 400 according to the present invention is shown in FIG. 5 as almost the same in construction as the third embodiment of the digital filter coefficient setting apparatus 300 according to the present invention except for the constitution elements and parts in the following description. Description about the same elements and parts of the fourth preferred embodiment as those of the third preferred embodiment will be omitted to avoid tedious repetition but the same references are given in FIG. 5 for the elements and parts of the fourth preferred embodiment as those of the third preferred embodiment in FIG. 4.

In contrast to the digital filter coefficient setting apparatus 300, the digital filter coefficient setting apparatus 400 comprises a calculated coefficient storing unit 413, a coefficient storing unit 408 in place of the calculated coefficient storing unit 313 and the coefficient storing unit 108. The digital filter coefficient setting apparatus 400 further comprises a coefficient writing unit 414. The coefficient writing unit 414 is adapted to write one or more specified filter coefficient elements stored in the calculated coefficient storing unit 413 into the coefficient storing unit 408 in association with respective one or more specified coefficient parameters. The calculated coefficient storing unit 413 may be a volatile storing unit. This means that the calculated coefficient storing unit 413 may lose its information stored therein when the digital filter coefficient setting apparatus 400 is powered-off.

The operation of the digital filter coefficient setting apparatus 400 according to the present invention is almost the same as that of the digital filter coefficient setting apparatus 300 except for the following operation.

The coefficient writing unit 414 is operated to write one or more specified filter coefficient elements stored in the calculated coefficient storing unit 413 in association with respective one or more specified coefficient parameters into the coefficient storing unit 408. Preferably, the coefficient writing unit 414 may write a plurality of specified filter coefficient elements accumulatively stored in the calculated coefficient storing unit 413 in association with respective specified coefficient parameters into the coefficient storing unit 408 at a predetermined time. More preferably, the coefficient writing unit 414 may write a plurality of specified filter coefficient elements accumulatively stored in the calculated coefficient storing unit 413 respectively in association with respective specified coefficient parameters into the coefficient storing unit 408 at a time, for example, just before the digital filter coefficient setting apparatus 400 is powered-off while a few operations are carried out in the digital filter coefficient setting apparatus 400.

While it has been described in the above that the digital filter coefficient setting apparatus 400 comprises the switching unit 110, the digital filter coefficient setting apparatus 400 according to the present invention may not comprise the switching unit 110 as described in the previous embodiment.

From the foregoing description, it will be understood that the digital filter coefficient setting apparatus 400 according to the present invention comprises a coefficient writing unit 414 for writing. one or more specified filter coefficient elements stored in the calculated coefficient storing unit 413 in association with respective one or more specified coefficient parameters into the coefficient storing unit 408, thereby making it possible for the digital filter coefficient setting apparatus 400 to store the one or more specified filter coefficient elements calculated by the coefficient calculating unit 306 in association with respective specified filter coefficient parameters even though the digital filter coefficient setting apparatus 400 is powered-off and the calculated coefficient storing unit 413 loses it information stored therein.

The fifth preferred embodiment of the digital filter coefficient setting apparatus according to the present invention will now be described in detail in accordance with the accompanying drawings.

Figure 6:
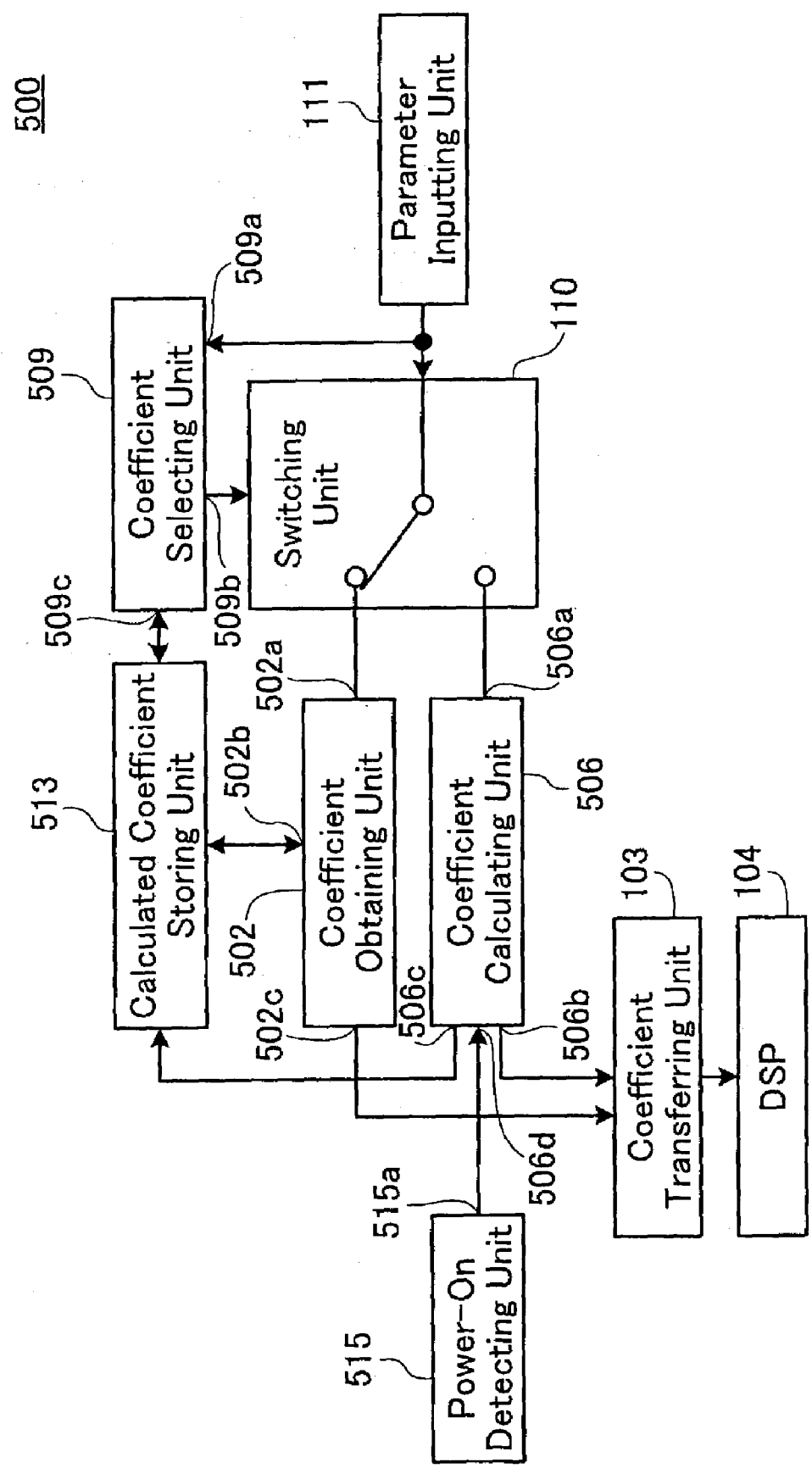
FIG. 6 is a block diagram of a fifth embodiment of a digital filter coefficient setting apparatus according to the present invention.

Referring now to the drawings, in particular to FIG. 6, there is shown a fifth preferred embodiment of the digital filter coefficient setting apparatus 500 according to the present invention.

The constitution of the fifth embodiment of the digital filter coefficient setting apparatus 500 according to the present invention will be described.

The digital filter coefficient setting apparatus 500 according to the present invention is shown in FIG. 6 as almost the same in construction as the third embodiment of the digital filter coefficient setting apparatus 300 according to the present invention except for the constitution elements and parts in the following description. Description about the same elements and parts of the fifth preferred embodiment as those of the third preferred embodiment will be omitted to avoid tedious repetition but the same references are given in FIG. 6 for the elements and parts of the fifth preferred embodiment as those of the third preferred embodiment in FIG. 4.

In contrast to the digital filter coefficient setting apparatus 300, the digital filter coefficient setting apparatus 500 comprises a coefficient selecting unit 509, a coefficient obtaining unit 502, a coefficient calculating unit 506, and a calculated coefficient storing unit 513 in place of the coefficient selecting unit 309, the coefficient obtaining unit 302, the coefficient calculating unit 306, the coefficient storing unit 108, and the calculated coefficient storing unit 313. The digital filter coefficient setting apparatus 500 further comprises a power-on detecting unit 515. The power-on detecting unit 515 is adapted to detect that the digital filter coefficient setting apparatus 500 is powered-on, and output a power-on signal to the coefficient calculating unit 506 when it is detected that the digital filter coefficient setting apparatus 500 is powered-on. The coefficient calculating unit 506 has a storage portion, not shown, for storing a predetermined number of fundamental coefficient parameters. The calculated coefficient storing unit 513 is a volatile storing unit. This means that the calculated coefficient storing unit 513 loses its information stored therein when the digital filter coefficient setting apparatus 500 is powered-off.

The operation of the digital filter coefficient setting apparatus 500 according to the present invention is almost the same as that of the digital filter coefficient setting apparatus 300 except for the following operation.

The power-on detecting unit 515 is operated to detect that the digital filter coefficient setting apparatus 500 is powered-on. The power-on detecting unit 515 is then operated to output a power-on signal to the coefficient calculating unit 506. The coefficient calculating unit 506 is operated to calculate a predetermined number of fundamental filter coefficient elements on the basis of the fundamental coefficient parameters stored in the storage portion in response to the power-on signal outputted by the power-on detecting unit 515. The calculated coefficient storing unit 513 is operated to store the fundamental filter coefficient elements thus calculated by the coefficient calculating unit 506 in association with the respective fundamental coefficient parameters stored in the storage portion of the coefficient calculating unit 506.

Preferably, the fundamental coefficient parameters should be one or more coefficient parameters expected to be frequently inputted by the parameter inputting unit 111. Preferably, the fundamental filter coefficient elements should be one or more filter coefficient elements expected to be frequently searched and selected by the coefficient selecting unit 509.

While it has been described in the above that the digital filter coefficient setting apparatus 500 comprises the switching unit 110, the digital filter coefficient setting apparatus 500 according to the present invention may not comprise the switching unit 110 as described in the previous embodiment.

From the foregoing description, it will be understood that the digital filter coefficient setting apparatus 500 according to the present invention comprising a power-on detecting unit 515 for detecting that the digital filter coefficient setting apparatus 500 is powered-on, and outputting a power-on signal to the coefficient calculating unit 506 when it is detected that the digital filter coefficient setting apparatus 500 is powered-on, makes it possible for the coefficient calculating unit 506 to calculate a predetermined number of fundamental filter coefficient elements on the basis of the fundamental coefficient parameters stored therein, and for the calculated coefficient storing unit 513 to store the predetermined number of fundamental filter coefficient elements thus calculated by the coefficient calculating unit 506 in association with the respective fundamental coefficient parameters. The digital filter coefficient setting apparatus 500 thus constructed does not need to store a plurality of filter coefficient elements in a nonvolatile storing unit.

The sixth preferred embodiment of the digital filter coefficient setting apparatus according to the present invention will now be described in detail in accordance with the accompanying drawings.

Figure 7:
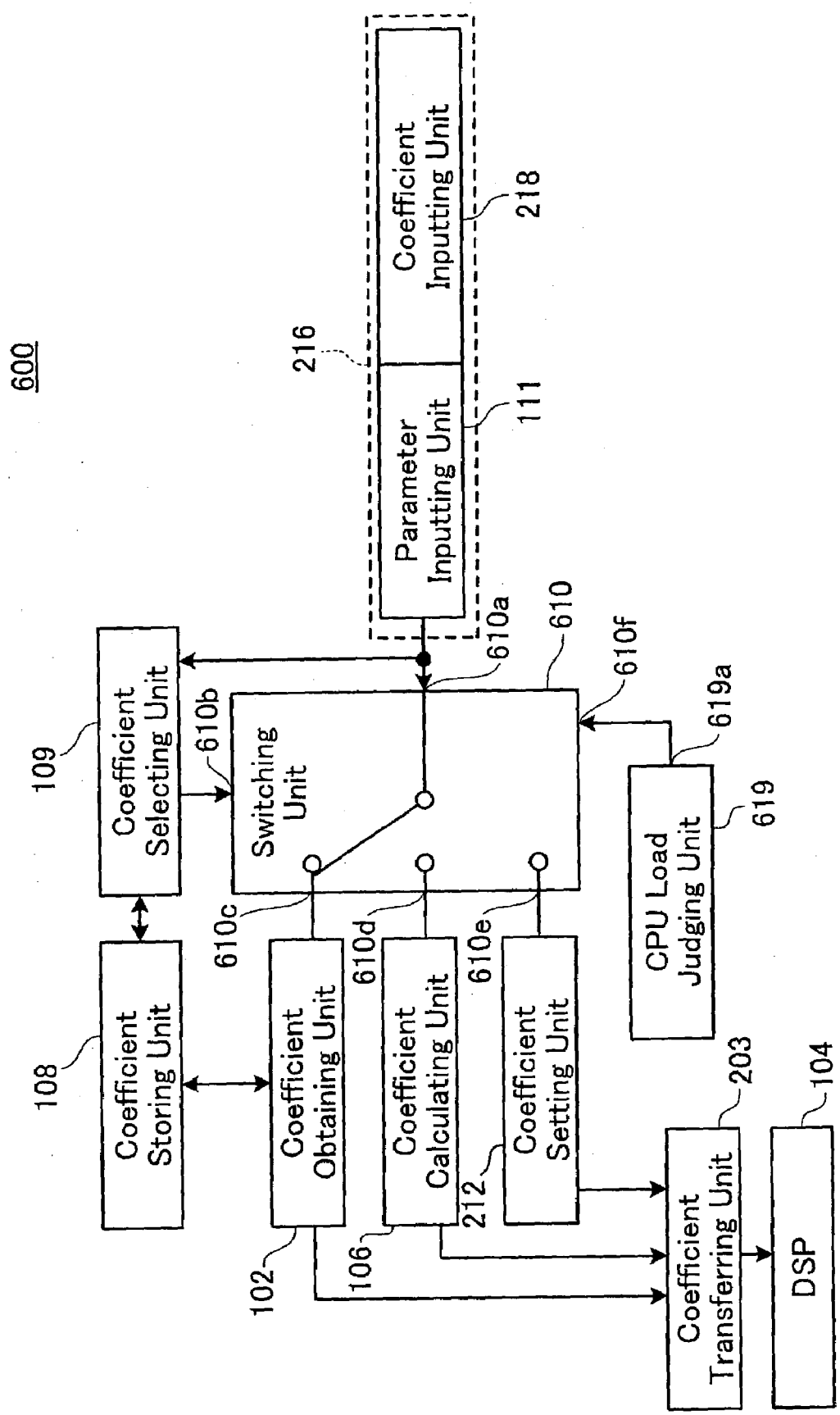
FIG. 7 is a block diagram of a sixth embodiment of a digital filter coefficient setting apparatus according to the present invention.

Referring now to the drawings, in particular to FIG. 7, there is shown a sixth preferred embodiment of the digital filter coefficient setting apparatus 600 according to the present invention.

The constitution of the sixth embodiment of the digital filter coefficient setting apparatus 600 according to the present invention will be described.

The digital filter coefficient setting apparatus 600 according to the present invention is shown in FIG. 7 as almost the same in construction as the second embodiment of the digital filter coefficient setting apparatus 200 according to the present invention except for the constitution elements and parts in the following description. Description about the same elements and parts of the sixth preferred embodiment as those of the second preferred embodiment will be omitted to avoid tedious repetition but the same references are given in FIG. 7 for the elements and parts of the sixth preferred embodiment as those of the second preferred embodiment in FIG. 2.

In contrast to the digital filter coefficient setting apparatus 200, the digital filter coefficient setting apparatus 600 comprises a switching unit 610 in place of the switching unit 210. The digital filter coefficient setting apparatus 600 further comprises a CPU load judging unit 619. The digital filter coefficient setting apparatus 200 comprises a CPU, not shown, for controlling operations performed in the digital filter coefficient setting apparatus 600. The CPU has a CPU load. The CPU load fluctuates in response to the operations. The CPU load judging unit 619 is adapted to measure the CPU load of the CPU, and to judge whether the CPU load thus measured exceeds a predetermined value or not. The CPU load judging unit 619 is adapted to output a first signal when it is judged that the CPU load thus measured does not exceed a predetermined value, and to output a second signal when it is judged that the CPU load thus measured exceeds a predetermined value.

The parameter inputting unit 111 and the coefficient inputting unit 218 collectively forms a command inputting unit 216. The command inputting unit 216 may input the specified coefficient parameter and the specified filter coefficient signal. When the command inputting unit 216 inputs the specified coefficient parameter and the specified filter coefficient signal, the switching unit 610 assumes two switching modes including a first switching mode to selectively output the address to the coefficient obtaining unit 102 and the specified coefficient parameter to the coefficient calculating unit 106, and a second switching mode to output the specified filter coefficient signal to the coefficient setting unit 212.

The operation of the digital filter coefficient setting apparatus 600 according to the present invention is almost the same as that of the digital filter coefficient setting apparatus 200 except for the following operation.

The command inputting unit 216 is operated to input the specified coefficient parameter and the specified filter coefficient signal. The CPU load judging unit 619 is operated to measure the CPU load of the CPU, and to judge whether the CPU load thus measured exceeds a predetermined value or not.

When it is judged that that the CPU load thus measured does not exceed a predetermined value, the CPU load judging unit 619 is operated to output a first signal. The switching unit 610 is operated to assume the first switching mode to selectively output the address to the coefficient obtaining unit 102 and the specified coefficient parameter to the coefficient calculating unit 106 in response to the first signal.

When, on the other hand, it is judged that that the CPU load thus measured exceeds a predetermined value, the CPU load judging unit 619 is operated to output a second signal. The switching unit 610 is operated to assume the second switching mode to output the specified filter coefficient signal to the coefficient setting unit 212 in response to the second signal.

While it has been described in the above that the digital filter coefficient setting apparatus 600 comprises the switching unit 610, the digital filter coefficient setting apparatus 600 according to the present invention may not comprise the switching unit 610 as described hereinlater.

The command inputting unit 216 of the digital filter coefficient setting apparatus 600 according to the present invention comprising no switching unit 610 may assume two outputting modes including a first outputting mode to output the specified coefficient parameter to the coefficient selecting unit 109 and a second outputting mode to output the specified filter coefficient signal to the coefficient setting unit 212 when the specified coefficient parameter and the specified filter coefficient signal are inputted therein.

The description hereinlater will be directed to the operation performed by the aforesaid command inputting unit 216.

The command inputting unit 216 is operated to input the specified coefficient parameter and the specified filter coefficient signal. The CPU load judging unit 619 is operated to measure the CPU load of the CPU, and to judge whether the CPU load thus measured exceeds a predetermined value or not.

When it is judged that that the CPU load thus measured does not exceed a predetermined value, the CPU load judging unit 619 is operated to output a first signal. The command inputting unit 216 is operated to assume the first outputting mode to output the specified coefficient parameter to the coefficient selecting unit 109 in response to the first signal. When, on the other hand, it is judged that that the CPU load thus measured exceeds a predetermined value, the CPU load judging unit 619 is operated to output a second signal. The command inputting unit 216 is operated to assume the second outputting mode to output the specified filter coefficient signal to the coefficient setting unit 212 in response to the second signal.

From the foregoing description, it is to be understood that the digital filter coefficient setting apparatus 600 comprising a CPU load judging unit 619 for measuring the CPU load of the CPU, and judging whether the CPU load thus measured exceeds a predetermined value or not, can selectively carry out two operation modes consisting of a first operation mode of obtaining the specified filter coefficient element on the basis of the specified coefficient parameter and a second operation mode of specifying the specified filter coefficient element on the basis of the specified filter coefficient signal in accordance with the CPU load thus judged when the specified coefficient parameter and the specified filter coefficient signal are inputted therein, thereby enabling to efficiently set the digital filter in accordance with the specified coefficient parameter.

The seventh preferred embodiment of the digital filter coefficient setting apparatus according to the present invention will now be described in detail in accordance with the accompanying drawings.

Figure 8:
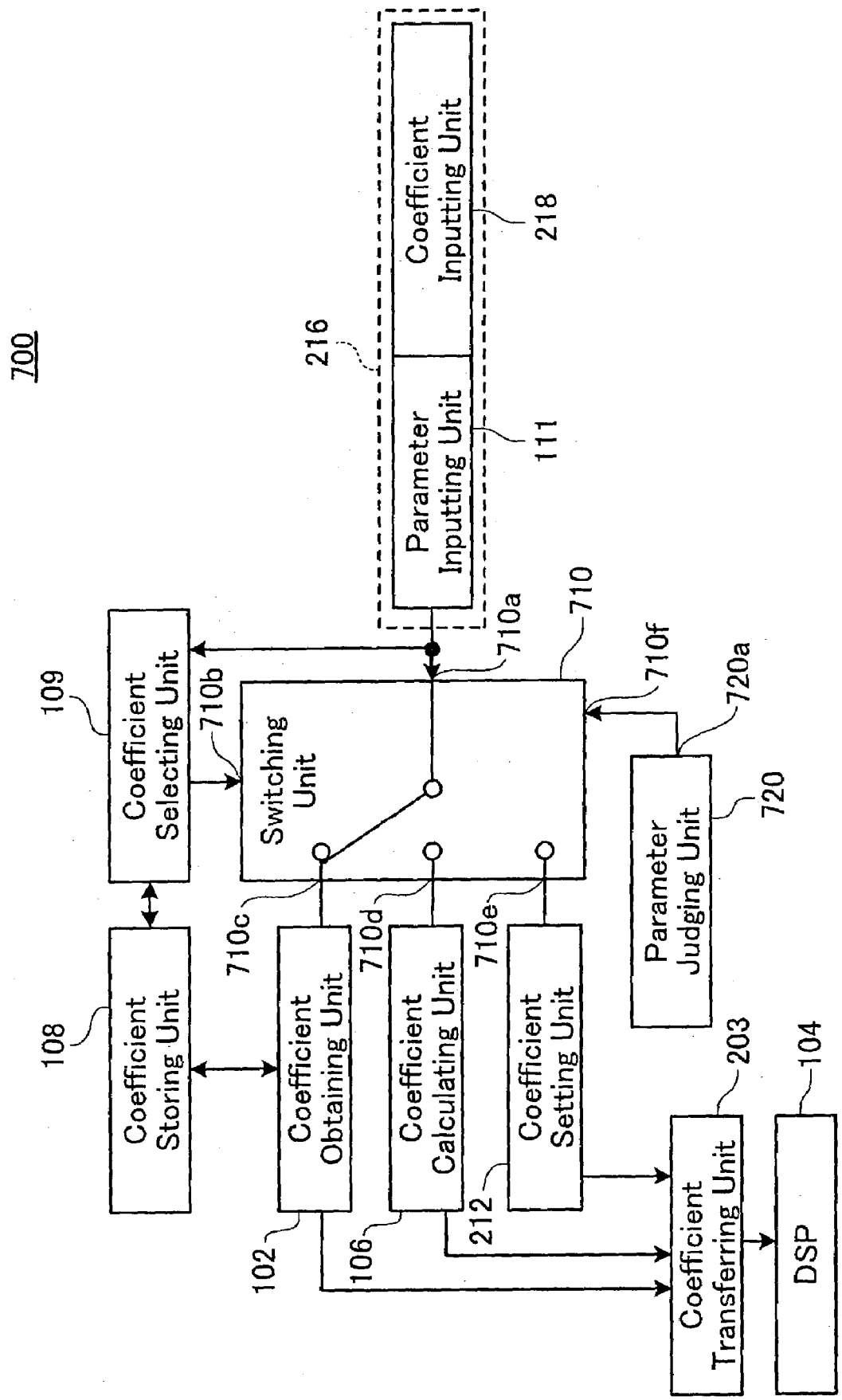
FIG. 8 is a block diagram of a seventh embodiment of a digital filter coefficient setting apparatus according to the present invention.

Referring now to the drawings, in particular to FIG. 8, there is shown a seventh preferred embodiment of the digital filter coefficient setting apparatus 700 according to the present invention.

The constitution of the seventh embodiment of the digital filter coefficient setting apparatus 700 according to the present invention will be described.

The digital filter coefficient setting apparatus 700 according to the present invention is shown in FIG. 8 as almost the same in construction as the second embodiment of the digital filter coefficient setting apparatus 200 according to the present invention except for the constitution elements and parts in the following description. Description about the same elements and parts of the seventh preferred embodiment as those of the second preferred embodiment will be omitted to avoid tedious repetition but the same references are given in FIG. 8 for the elements and parts of the seventh preferred embodiment as those of the second preferred embodiment in FIG. 2.

In contrast to the digital filter coefficient setting apparatus 200, the digital filter coefficient setting apparatus 700 comprises a switching unit 710 in place of the switching unit 210. The digital filter coefficient setting apparatus 700 further comprises a parameter judging unit 720. The coefficient calculating unit 106 is operative to calculate a specified filter coefficient element on the basis of a specified coefficient parameter within a predetermined range. The parameter judging unit 720 is adapted to judge whether the specified coefficient parameter inputted by the parameter inputting unit 111 is within the range or not. The parameter judging unit 720 is adapted to output a third signal when it is judged that the specified coefficient parameter inputted by the parameter inputting unit 111 is within the range. The parameter judging unit 720 is adapted to output a fourth signal when it is judged that the specified coefficient parameter inputted by the parameter inputting unit 111 is beyond the range.

The command inputting unit 216 may input the specified coefficient parameter and the specified filter coefficient signal. When the command inputting unit 216 inputs the specified coefficient parameter and the specified filter coefficient signal, the switching unit 710 assumes two switching modes including a first switching mode to selectively output the address to the coefficient obtaining unit 102 and the specified coefficient parameter to the coefficient calculating unit 106 and a second switching mode to output the specified filter coefficient signal to the coefficient setting unit 212.

The operation of the digital filter coefficient setting apparatus 700 according to the present invention is almost the same as that of the digital filter coefficient setting apparatus 200 except for the following operation.

The command inputting unit 216 is operated to input the specified coefficient parameter and the specified filter coefficient signal. The parameter judging unit 720 is operated to judge whether the specified coefficient parameter inputted by the parameter inputting unit 111 is within the range or not.

When it is judged that the specified coefficient parameter inputted by the parameter inputting unit 111 is within the range, the parameter judging unit 720 is operated to output a third signal. The switching unit 710 is operated to assume the first switching mode to selectively output the address to the coefficient obtaining unit 102 and the specified coefficient parameter to the coefficient calculating unit 106 in response to the third signal.

When, on the other hand, it is judged that the specified coefficient parameter inputted by the parameter inputting unit 111 is beyond the range, the parameter judging unit 720 is operated to output a fourth signal. The switching unit 710 is operated to assume the second switching mode to output the specified filter coefficient signal to the coefficient setting unit 212 in response to the fourth signal.

While it has been described in the above that the digital filter coefficient setting apparatus 700 comprises the switching unit 710, the digital filter coefficient setting apparatus 700 according to the present invention may not comprise the switching unit 710 as described hereinlater.

The command inputting unit 216 of the digital filter coefficient setting apparatus 700 according to the present invention comprising no switching unit 710 may assume two outputting modes including a first outputting mode to output the specified coefficient parameter to the coefficient selecting unit 109 and a second outputting mode to output the specified filter coefficient signal to the coefficient setting unit 212 when the specified coefficient parameter and the specified filter coefficient signal are inputted therein.

The description hereinlater will be directed to the operation performed by the aforesaid command inputting unit 216.

The command inputting unit 216 is operated to input the specified coefficient parameter and the specified filter coefficient signal. The parameter judging unit 720 is operated to judge whether the specified coefficient parameter inputted by the parameter inputting unit 111 is within the range or not.

When it is judged that the specified coefficient parameter inputted by the parameter inputting unit 111 is within the range, the parameter judging unit 720 is operated to output a third signal. The command inputting unit 216 is operated to assume the first outputting mode to output the specified coefficient parameter to the coefficient selecting unit 109 in response to the third signal.

When, on the other hand, it is judged that the specified coefficient parameter inputted by the parameter inputting unit 111 is beyond the range, the parameter judging unit 720 is operated to output a fourth signal. The command inputting unit 216 is operated to assume the second outputting mode to output the specified filter coefficient signal to the coefficient setting unit 212 in response to the fourth signal.

From the foregoing description, it is to be understood that the digital filter coefficient setting apparatus 700 comprising a parameter judging unit 720 for judging whether the specified coefficient parameter inputted by the parameter inputting unit 111 is within the range or not, can obtain the specified filter coefficient element on the basis of the specified filter coefficient signal when it is judged that the specified coefficient parameter is beyond the range, thereby enabling efficiently set the digital filter.

The eighth preferred embodiment of the digital filter coefficient setting apparatus according to the present invention will now be described in detail in accordance with the accompanying drawings.

Figure 9:
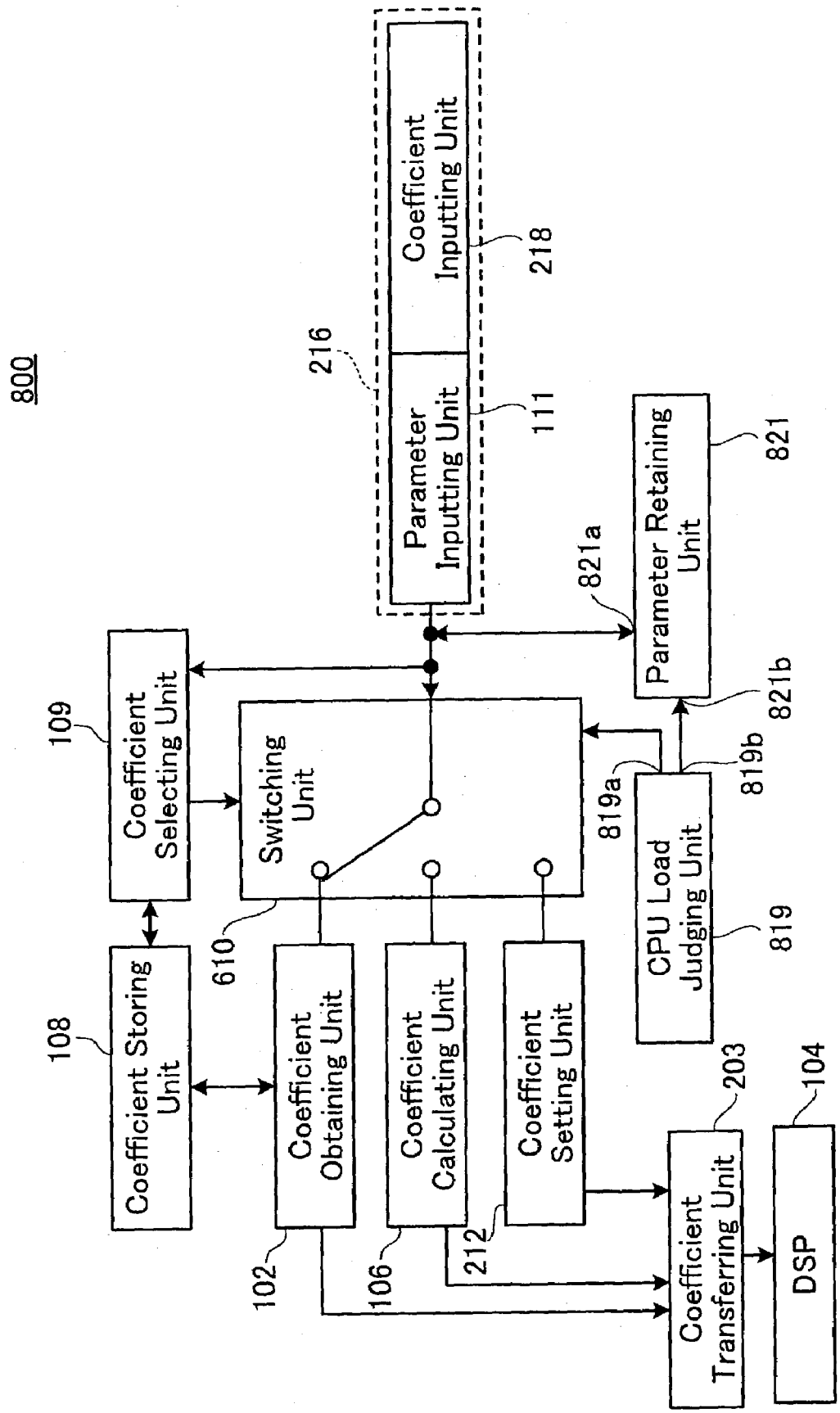
FIG. 9 is a block diagram of an eighth embodiment of a digital filter coefficient setting apparatus according to the present invention.

Referring now to the drawings, in particular to FIG. 9, there is shown an eighth preferred embodiment of the digital filter coefficient setting apparatus 800 according to the present invention.

The constitution of the eighth embodiment of the digital filter coefficient setting apparatus 800 according to the present invention will be described.

The digital filter coefficient setting apparatus 800 according to the present invention is shown in FIG. 9 as almost the same in construction as the sixth embodiment of the digital filter coefficient setting apparatus 600 according to the present invention except for the constitution elements and parts in the following description. Description about the same elements and parts of the eighth preferred embodiment as those of the sixth preferred embodiment will be omitted to avoid tedious repetition but the same references are given in FIG. 9 for the elements and parts of the eighth preferred embodiment as those of the second preferred embodiment in FIG. 7.

In contrast to the digital filter coefficient setting apparatus 600, the digital filter coefficient setting apparatus 800 comprises a CPU load judging unit 819 in place of the CPU load judging unit 619. The digital filter coefficient setting apparatus 800 further comprises a parameter retaining unit 821. The parameter retaining unit 821 is adapted to retain a specified coefficient parameter lastly inputted by the parameter inputting unit 111.

The operation of the digital filter coefficient setting apparatus 800 according to the present invention is almost the same as that of the digital filter coefficient setting apparatus 600 except for the following operation.

The command inputting unit 216 is operated to input the specified coefficient parameter and the specified filter coefficient signal therein. It is assumed that the specified filter coefficient element corresponding to the lastly inputted specified filter coefficient parameter has not yet been calculated nor obtained.

The CPU load judging unit 819 is operated to measure the CPU load of the CPU, and to judge whether the CPU load thus measured exceeds a predetermined value or not.

When it is judged that that the CPU load thus measured does not exceed a predetermined value, the CPU load judging unit 619 is operated to output a first signal to the parameter retaining unit 821. The parameter retaining unit 821 is operated to output the specified coefficient parameter lastly inputted to the coefficient selecting unit 109 in response to the first signal.

While it has been described in the foregoing embodiments that the digital filter coefficient setting apparatus according to the present invention comprises the digital filter, the digital filter may not be included in, but operably connected with the digital filter coefficient setting apparatus according to the present invention.

From the foregoing description, it is to be understood that the digital filter coefficient setting apparatus 800 comprising a CPU load judging unit 819 for measuring the CPU load of the CPU, and judging whether the CPU load thus measured exceeds a predetermined value or not, and a parameter retaining unit 821 for retaining a specified coefficient parameter lastly inputted by the parameter inputting unit 111, can obtain or calculate the specified filter coefficient element corresponding to the specified coefficient parameter lastly inputted when the CPU load is below the predetermined value, thereby enabling to efficiently set the digital filter in accordance with the specified coefficient parameter as well as to enhance the accuracy of the specified filter coefficient element.

The many features and advantages of the invention are apparent from the detailed specification, and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described herein, and accordingly, all suitable modifications and equivalents may be construed as being encompassed within the scope of the invention.

What is claimed is:

1. A digital filter coefficient setting apparatus comprising:
   a processor including a digital filter for filtering a digital signal in accordance with a digital filter characteristic varied in response to a filter coefficient element;
   a coefficient storing unit for storing a plurality of filter coefficient elements respectively in association with a plurality of coefficient parameters;
   a parameter inputting unit for inputting a specified coefficient parameter;
   a coefficient selecting unit for selecting a specified filter coefficient element corresponding to said specified coefficient parameter inputted by said parameter inputting unit from among said plurality of filter coefficient elements stored in said coefficient storing unit, and judging whether said specified filter coefficient element is selected or not from among said plurality of filter coefficient elements stored in said coefficient storing unit;
   a coefficient obtaining unit for obtaining said specified filter coefficient element stored in said coefficient storing unit with reference to an address and outputting said specified filter coefficient element thus obtained to said processor; and
   a coefficient calculating unit for calculating a specified filter coefficient element on the basis of said specified coefficient parameter inputted by said parameter inputting unit and outputting said specified filter coefficient element thus calculated to said processor and in which
   said coefficient selecting unit is operative to output an address indicative of a location of said specified filter coefficient element in said coefficient storing unit to have said coefficient obtaining unit obtain said specified filter coefficient element when it is judged that said specified filter coefficient element is selected, and to output said specified coefficient parameter to have said coefficient calculating unit calculate said specified filter coefficient element when it is judged that said specified filter coefficient element is not selected, and said processor is operative to set said digital filter in response to said filter coefficient element selectively obtained by said coefficient obtaining unit and calculated by said coefficient calculating unit.

2. A digital filter coefficient setting apparatus as set forth in claim 1, further comprising a coefficient transferring unit for transferring said specified filter coefficient element obtained by said coefficient obtaining unit to said processor when said specified filter coefficient element is inputted from said coefficient obtaining unit and transferring said specified filter coefficient element calculated by said coefficient calculating unit to said processor when said specified filter coefficient element is inputted from said coefficient calculating unit.

3. A digital filter coefficient setting apparatus as set forth in claim 1, in which said coefficient selecting unit is operative to output a calculation signal when it is judged that said specified filter coefficient element is not selected, which further comprises a switching unit for outputting said address to said coefficient obtaining unit in response to address, and outputting said specified coefficient parameter to said coefficient calculating unit in response to said calculation signal.

4. A digital filter coefficient setting apparatus as set forth in claim 1, further comprising:

a coefficient inputting unit for inputting a specified filter coefficient signal; and a coefficient setting unit for specifying a specified filter coefficient element in accordance with said specified filter coefficient signal inputted by said coefficient inputting unit.

5. A digital filter coefficient setting apparatus as set forth in claim 4, further comprising a coefficient transferring unit for transferring said specified filter coefficient element obtained by said coefficient obtaining unit to said processor in response to said specified filter coefficient element inputted from said coefficient obtaining unit, transferring said specified filter coefficient element calculated by said coefficient calculating unit to said processor in response to said specified filter coefficient element inputted from said coefficient calculating unit, and transferring said specified filter coefficient element specified by said coefficient setting unit to said processor in response to said specified filter coefficient element specified by said coefficient setting unit.

6. A digital filter coefficient setting apparatus as set forth in claim 4, further comprising:

a CPU for controlling operation performed in said digital filter coefficient setting apparatus,said CPU having a CPU load in response to said operations;and a CPU load judging unit for measuring said CPU load of said CPU, judge whether said CPU load thus measured exceeds a predetermined value or not,and outputting a first signal when it is judged that said CPU laod thus measured does not exceed a predetermined value, and a second signal when it is judged that said CPU load thus measured exceeds a predetermined value, said parameter inputting unit and said coefficient inputting unit collectively forming a command inputting unit, and command inputting unit assuming two outputting modes including a first outputting mode to output said specified coefficient parameter to said coefficient selecting unit and a second outputting mode to output said specified filter coefficient signal to said coefficient setting unit when said specified coefficient parameter and said specified filter coefficient signal are inputted, in which said command inputting unit is operative to assume said first outputting mode to output said specified coefficient parameter to said coefficient selecting unit in response to said first signal and to assume said second outputting mode to output said specified filter coefficient signal to said coefficient setting unit in response to said second signal when said specified coefficient parameter and said specified filter cofficient signal are inputted.

7. A digital filter coefficient setting apparatus as set forth in claim 4, in which said coefficient calculating unit is operative to calculate a specified filter coefficient element on the basis of a specified coefficient parameter within a predetermined range, which further comprises:

a parameter judging unit for judging whether said specified coefficient parameter inputted by said parameter inputting unit is within said range or not and outputting a third signal when it is judged that said specified coefficient parameter inputted by said parameter inputting unit is within said range, and a fourth signal when it is judged that said specified coefficient parameter inputted by said parameter inputting unit is beyond said range, said parameter inputting unit and said coefficient inputting unit collectively forming a command inputting unit, said command inputting unit assuming two outputting modes including a first outputting mode to output said specified coefficient parameter to said coefficient selecting unit and a second outputting mode to output said specified filter coefficient signal to said coefficient setting unit when said specified coefficient parameter and said specified filter coefficient signal are inputted, in which said command inputting unit is operative to assume said first outputting mode to output said specified coefficient parameter to said coefficient selecting unit in response to said third signal and to assume said second outputting mode to output said specified filter coefficient signal to said coefficient setting unit in response to said fourth signal when said specified coefficient parameter and said specified filter coefficient signal are inputted.

8. A digital filter coefficient setting apparatus as set forth in claim 6, further comprising:

a parameter retaining unit for retaining a specified coefficient parameter lastly inputted by said parameter inputting unit, said parameter inputting unit and said coefficient inputting unit collectively forming a command inputting unit, in which said parameter retaining unit is operative to output said specified coefficient parameter lastly inputted to said coefficient selecting unit in response to said first signal from said CPU load judging unit if said lastly inputted specified coefficient parameter has not been inputted to said coefficient selecting unit.

9. A digital filter coefficient setting apparatus as set forth in claim 4, in which said coefficient selecting unit is operative to output a calculation signal when it is judged that said specified filter coefficient element is not selected, which further comprises a switching unit for outputting said address to said coefficient obtaining unit in response to said address inputted from said coefficient selecting unit, outputting said specified coefficient parameter to said coefficient calculating unit in response to said calculation signal inputted from said coefficient selecting unit, and outputting said specified filter coefficient signal to said coefficient setting unit in response to said specified filter coefficient signal inputted by said coefficient inputting unit.

10. A digital filter coefficient setting apparatus as set forth in claim 9, further comprising:
 a CPU for controlling operations performed in said digital filter coefficient setting apparatus, said CPU having a CPU load fluctuated in response to said operations; and
 a CPU load judging unit for measuring said CPU load of said CPU, judging whether said CPU load thus measured exceeds a predetermined value or not, and outputting a first signal when it is judged that said CPU load thus measured does not exceed a predetermined value, and a second signal when it is judged that said CPU load thus measured exceeds a predetermined value,
 said parameter inputting unit and said coefficient inputting unit collectively forming a command inputting unit, and
 said switching unit assuming two switching modes including a first switching mode to selectively output said address to said coefficient obtaining unit and said specified coefficient parameter to said coefficient calculating unit, and a second switching mode to output said specified filter coefficient signal to said coefficient setting unit when said specified coefficient parameter and said specified filter coefficient signal are inputted, in which
 said switching unit is operative to assume said first switching mode to selectively output said address to said coefficient obtaining unit and said specified coefficient parameter to said coefficient calculating unit in response to said first signal and to assume said second switching mode to output said specified filter coefficient signal to said coefficient setting unit in response to said second signal when said specified coefficient parameter and said specified filter coefficient signal are inputted.

11. A digital filter coefficient setting apparatus as set forth in claim 6, in which
 said coefficient calculating unit is operative to calculate a specified filter coefficient element on the basis of a specified coefficient parameter within a predetermined range,
 which further comprises:
 a parameter judging unit for judging whether said specified coefficient parameter inputted by said parameter inputting unit is within said range or not and outputting a third signal when it is judged that said specified coefficient parameter inputted by said parameter inputting unit is within said range, and a fourth signal when it is judged that said specified coefficient parameter inputted by said parameter inputting unit is beyond said range,
 said parameter inputting unit and said coefficient inputting unit collectively forming a conrmand inputting unit,
 said switching unit assuming two switching modes including a first switching mode to selectively output said address to said coefficient obtaining unit and said specified coefficient parameter to said coefficient calculating unit and a second switching mode to output said specified filter coefficient signal to said coefficient setting unit when said specified coefficient parameter and said specified filter coefficient signal are inputted, in which
 said switching unit is operative to assume said first switching mode to selectively output said address to said coefficient obtaining unit and said specified coefficient parameter to said coefficient calculating unit in response to said third signal and to assume said second switching mode to output said specified filter coefficient signal to said coefficient setting unit in response to said fourth signal when said specified coefficient parameter and said specified filter coefficient signal are inputted.

12. A digital filter coefficient setting apparatus as set forth in claim 1, further comprising:
 a calculated coefficient storing unit for storing said specified filter coefficient element calculated by said coefficient calculating unit in association with said specified coefficient parameter inputted by said parameter inputting unit therein, in which
 said coefficient selecting unit is operative to search and select a specified filter coefficient element corresponding to said specified coefficient parameter inputted by said parameter inputting unit from among said plurality of filter coefficient elements stored in said coefficient storing unit and said calculated coefficient storing unit, to judge whether said specified filter coefficient element is selected or not from among said plurality of filter coefficient elements stored in said coefficient storing unit and said calculated coefficient storing unit, to output an address indicating a location of said specified filter coefficient element in said coefficient storing unit and said calculated coefficient storing unit when it is judged that said specified filter coefficient element is searched and selected in said coefficient storing unit and said calculated coefficient storing unit, and to output said specified coefficient parameter to said coefficient calculating unit when it is judged that said specified filter coefficient element is not selected in said coefficient storing unit and said calculated coefficient storing unit, and
 said coefficient obtaining unit is operative to obtain said specified filter coefficient element stored in said coefficient storing unit and said calculated coefficient storing unit with reference to said address outputted by said coefficient selecting unit, and to output said specified filter coefficient element thus obtained to said processor.

13. A digital filter coefficient setting apparatus as set forth in claim 12, further comprising:
 a coefficient writing unit for writing one or more specified filter coefficient elements stored in said calculated coefficient storing unit in association with respective one or more specified coefficient parameters into said coefficient storing unit.

14. A digital filter coefficient setting apparatus as set forth in claim 12, in which
 said calculated coefficient storing unit includes said coefficient storing unit.

15. A digital filter coefficient setting apparatus as set forth in claim 14, in which
 said calculated coefficient storing unit is operative to clear said specified filter coefficient elements stored therein when said digital filter coefficient setting apparatus is powered-off, which further comprises:
 a power-on detecting unit for detecting that said digital filter coefficient setting apparatus is powered-on, and outputting a power-on signal to said coefficient calculating unit when it is detected that said digital filter coefficient setting apparatus is powered-on, in which said coefficient calculating unit has a storage portion for storing a predetermined number of fundamental coefficient parameters, said coefficient calculating unit is operative to calculate a predetermined number of fundamental filter coefficient elements on the basis of said fundamental coefficient parameters stored in said storage portion in response to said power-on signal outputted by said power-on detecting unit, and said calculated coefficient storing unit is operative to store said fundamental filter coefficient elements thus calculated by said coefficient calculating unit in association with said respective fundamental coefficient parameters stored in said storage portion of said coefficient calculating unit.

16. A digital filter coefficient setting method comprising the steps of:

a storing step of storing a plurality of filter coefficient elements respectively in association with a plurality of coefficient parameters in a coefficient storing unit;

a parameter inputting step of inputting a specified coefficient parameter;

a coefficient selecting step of searching and selecting a specified filter coefficient element corresponding to said specified coefficient parameter inputted in said parameter inputting step from among said plurality of filter coefficient elements stored in said coefficient storing unit;

a judging step of judging whether said specified filter coefficient element is selected or not from among said plurality of filter coefficient elements stored in the coefficient storing unit;

a coefficient obtaining step of obtaining said specified filter coefficient element stored in said coefficient storing unit with reference to an address;

a setting step of setting a digital filter in response to a filter coefficient element; and a coefficient calculating step of calculating a specified filter coefficient element on the basis of said specified coefficient parameter inputted in said parameter inputting step, and in which said coefficient selecting step has a step of outputting an address indicative of a location of said specified filter coefficient element in said coefficient storing unit to have said coefficient obtaining step have a step of obtaining said specified filter coefficient element when it is judged in said judging step that said specified filter coefficient element is selected, and a step of outputting said specified coefficient parameter to have said coefficient calculating step have a step of calculating said specified filter coefficient element when it is judged in said judging step that said specified filter coefficient element is not selected, and said setting step has a step of setting said digital filter in response to said filter coefficient element selectively obtained in said coefficient obtaining step and calculated in said coefficient calculating step.

17. A digital filter coefficient setting apparatus comprising:

a processor including a digital filter for filtering a digital signal in accordance with a digital filter characteristic varied in response to a filter coefficient element;

a coefficient storing unit for storing a plurality of filter coefficient elements respectively in association with a plurality of coefficient parameters;

a parameter inputting unit for inputting a specified coefficient parameter;

a coefficient selecting unit for selecting a specified filter coefficient element corresponding to said specified coefficient parameter inputted by said parameter inputting unit from among said plurality of filter coefficient elements stored in said coefficient storing unit, and judging whether said specified filter coefficient element is selected or not from among said plurality of filter coefficient elements stored in said coefficient storing unit;

a coefficient obtaining unit for obtaining said specified filter coefficient element stored in said coefficient storing unit with reference to an address, and outputting said specified filter coefficient element thus obtained to said processor; and a coefficient calculating unit for calculating a specified filter coefficient element on the basis of said specified coefficient parameter inputted by said parameter inputting unit and outputting said specified filter coefficient element thus calculated to said processor, and in which said coefficient selecting unit is operative to output an address indicative of a location of said specified filter coefficient element in said coefficient storing unit to have said coefficient obtaining unit obtain said specified filter coefficient element when it is judged that said specified filter coefficient element is selected, and to output said specified coefficient parameter to have said coefficient calculating unit calculate said specified filter coefficient element when it is judged that said specified filter coefficient element is not selected, and said processor is operative to set said digital filter in response to said filter coefficient element selectively obtained by said coefficient obtaining unit and calculated by said coefficient calculating unit, and which further comprises:

a calculated coefficient storing unit for storing said specified filter coefficient element calculated by said coefficient calculating unit in association with said specified coefficient parameter inputted by said parameter inputting unit therein, in which said coefficient selecting unit is operative to search and select a specified filter coefficient element corresponding to said specified coefficient parameter inputted by said parameter inputting unit from among said plurality of filter coefficient elements stored in said coefficient storing unit and said calculated coefficient storing unit, to judge whether said specified filter coefficient element is selected or not from among said plurality of filter coefficient elements stored in said coefficient storing unit and said calculated coefficient storing unit, to output an address indicating a location of said specified filter coefficient element in said coefficient storing unit and said calculated coefficient storing unit when it is judged that said specified filter coefficient element is selected in said coefficient storing unit and said calculated coefficient storing unit, and to output said specified coefficient parameter to said coefficient calculating unit when it is judged that said specified filter coefficient element is not selected in said coefficient storing unit and said calculated coefficient storing unit, and said coefficient obtaining unit is operative to obtain said specified filter coefficient element stored in said coefficient storing unit and said calculated coefficient storing unit with reference to said address outputted by said coefficient selecting unit, and to output said specified filter coefficient element thus obtained to said processor, said calculated coefficient storing unit includes said coefficient storing unit, said calculated coefficient storing unit is operative to clear said specified filter coefficient elements stored therein when said digital filter coefficient setting apparatus is powered-off, which further comprises:

a power-on detecting unit for detecting that said digital filter coefficient setting apparatus is powered-on, and outputting a power-on signal to said coefficient calculating unit when it is detected that said digital filter coefficient setting apparatus is powered-on, in which said coefficient calculating unit has a storage portion for storing a predetermined number of fundamental coefficient parameters, said coefficient calculating unit is operative to calculate a predetermined number of fundamental filter coefficient elements on the basis of said fundamental coefficient parameters stored in said storage portion in response to said power-on signal outputted by said power-on detecting unit, and said calculated coefficient storing unit is operative to store said fundamental filter coefficient elements thus calculated by said coefficient calculating unit in association with said respective fundamental coefficient parameters stored in said storage portion of said coefficient calculating unit.

18. A digital filter coefficient setting apparatus comprising:

a processor including a digital filter for filtering a digital signal in accordance with a digital filter characteristic varied in response to a filter coefficient element;

a coefficient storing unit for storing a plurality of filter coefficient elements respectively in association with a plurality of coefficient parameters;

a parameter inputting unit for inputting a specified coefficient parameter;

a coefficient selecting unit for selecting a specified filter coefficient element corresponding to said specified coefficient parameter inputted by said parameter inputting unit from among said plurality of filter coefficient elements stored in said coefficient storing unit, and judging whether said specified filter coefficient element is selected or not from among said plurality of filter coefficient elements stored in said coefficient storing unit;

a coefficient obtaining unit for obtaining said specified filter coefficient element stored in said coefficient storing unit with reference to an address, and outputting said specified filter coefficient element thus obtained to said processor; and a coefficient calculating unit for calculating a specified filter coefficient element on the basis of said specified coefficient parameter inputted by said parameter inputting unit and outputting said specified filter coefficient element thus calculated to said processor, and in which said coefficient selecting unit is operative to output an address indicative of a location of said specified filter coefficient element in said coefficient storing unit to have said coefficient obtaining unit obtain said specified filter coefficient element when it is judged that said specified filter coefficient element is selected, and to output said specified coefficient parameter to have said coefficient calculating unit calculate said specified filter coefficient element when it is judged that said specified filter coefficient element is not selected, and said processor is operative to set said digital filter in response to said filter coefficient element selectively obtained by said coefficient obtaining unit and calculated by said coefficient calculating unit, which further comprises:

a coefficient inputting unit for inputting a specified filter coefficient signal;

a coefficient setting unit for specifying a specified filter coefficient element in accordance with said specified filter coefficient signal inputted by said coefficient inputting unit, a CPU for controlling operations performed in said digital filter coefficient setting apparatus, said CPU having a CPU load fluctuated in response to said operations; and a CPU load judging unit for measuring said CPU load of said CPU, judging whether said CPU load thus measured exceeds a predetermined value or not, and outputting a first signal when it is judged that said CPU load thus measured does not exceed a predetermined value, and a second signal when it is judged that said CPU load thus measured exceeds a predetermined value, said parameter inputting unit and said coefficient inputting unit collectively forming a command inputting unit, said command inputting unit assuming two outputting modes including a first outputting mode to output said specified coefficient parameter to said coefficient selecting unit and a second outputting mode to output said specified filter coefficient signal to said coefficient setting unit when said specified coefficient parameter and said specified filter coefficient signal are inputted, and in which said command inputting unit is operative to assume said first outputting mode to output said specified coefficient parameter to said coefficient selecting unit in response to said first signal and to assume said second outputting mode to output said specified filter coefficient signal to said coefficient setting unit in response to said second signal when said specified coefficient parameter and said specified filter coefficient signal are inputted.

19. A digital filter coefficient setting apparatus as set forth in claim 18, further comprising:

a parameter retaining unit for retaining a specified coefficient parameter lastly inputted by said parameter inputting unit, said parameter inputting unit and said coefficient inputting unit collectively forming a command inputting unit, in which said parameter retaining unit is operative to output said specified coefficient parameter lastly inputted to said coefficient selecting unit in response to said first signal from said CPU load judging unit if said lastly inputted specified coefficient parameter has not been inputted to said coefficient selecting unit.

20. A digital filter coefficient setting apparatus comprising:

a processor including a digital filter for filtering a digital signal in accordance with a digital filter characteristic varied in response to a filter coefficient element;

a coefficient storing unit for storing a plurality of filter coefficient elements respectively in association with a plurality of coefficient parameters;

a parameter inputting unit for inputting a specified coefficient parameter;

a coefficient selecting unit for selecting a specified filter coefficient element corresponding to said specified coefficient parameter inputted by said parameter inputting unit from among said plurality of filter coefficient elements stored in said coefficient storing unit, and judging whether said specified filter coefficient element is selected or not from among said plurality of filter coefficient elements stored in said coefficient storing unit;

a coefficient obtaining unit for obtaining said specified filter coefficient element stored in said coefficient storing unit with reference to an address, and outputting said specified filter coefficient element thus obtained to said processor; and a coefficient calculating unit for calculating a specified filter coefficient element on the basis of said specified coefficient parameter inputted by said parameter inputting unit and outputting said specified filter coefficient element thus calculated to said processor, and in which said coefficient selecting unit is operative to output an address indicative of a location of said specified filter coefficient element in said coefficient storing unit to have said coefficient obtaining unit obtain said specified filter coefficient element when it is judged that said specified filter coefficient element is selected, and to output said specified coefficient parameter to have said coefficient calculating unit calculate said specified filter coefficient element when it is judged that said specified filter coefficient element is not selected, and said processor is operative to set said digital filter in response to said filter coefficient element selectively obtained by said coefficient obtaining unit and calculated by said coefficient calculating unit, which further comprises:

a coefficient inputting unit for inputting a specified filter coefficient signal; and a coefficient setting unit for specifying a specified filter coefficient element in accordance with said specified filter coefficient signal inputted by said coefficient inputting unit, and in which said coefficient selecting unit is operative to output a calculation signal when it is judged that said specified filter coefficient element is not selected, which further comprises a switching unit for outputting said address to said coefficient obtaining unit in response to said address inputted from said coefficient selecting unit, outputting said specified coefficient parameter to said coefficient calculating unit in response to said calculation signal inputted from said coefficient selecting unit, and outputting said specified filter coefficient signal to said coefficient setting unit in response to said specified filter coefficient signal inputted by said coefficient inputting unit, and which further comprises:

a CPU for controlling operations performed in said digital filter coefficient setting apparatus, said CPU having a CPU load fluctuated in response to said operations; and a CPU load judging unit for measuring said CPU load of said CPU, judging whether said CPU load thus measured exceeds a predetermined value or not, and outputting a first signal when it is judged that said CPU load thus measured does not exceed a predetermined value, and a second signal when it is judged that said CPU load thus measured exceeds a predetermined value, said parameter inputting unit and said coefficient inputting unit collectively forming a command inputting unit, and said switching unit assuming two switching modes including a first switching mode to selectively output said address to said coefficient obtaining unit and said specified coefficient parameter to said coefficient calculating unit, and a second switching mode to output said specified filter coefficient signal to said coefficient setting unit when said specified coefficient parameter and said specified filter coefficient signal are inputted, and in which said switching unit is operative to assume said first switching mode to selectively output said address to said coefficient obtaining unit and said specified coefficient parameter to said coefficient calculating unit in response to said first signal and to assume said second switching mode to output said specified filter coefficient signal to said coefficient setting unit in response to said second signal when said specified coefficient parameter and said specified filter coefficient signal are inputted.

* * * * *

UNITED STATES PATENT AND TRADEMARK OFFICE
CERTIFICATE OF CORRECTION

PATENT NO.        : 7,130,875 B2
APPLICATION NO.   : 10/368860
DATED             : October 31, 2006
INVENTOR(S)       : Ryoji Abe It is certified that error appears in the above-identified patent and that said Letters Patent is hereby corrected as shown below:

Column 23, Claim 6, Line 52: After "CPU load", please insert --fluctuated--.
Column 25, Claim 11, Line 42: Please delete "claim 6", and insert therefor --claim 9--.
Column 25, Claim 11, Line 58: Please delete "conrmand", and insert therefor --command--.

Signed and Sealed this

Thirteenth Day of March, 2007

JON W. DUDAS
*Director of the United States Patent and Trademark Office*